(12) United States Patent
Tourne

(10) Patent No.: US 9,603,255 B2
(45) Date of Patent: Mar. 21, 2017

(54) METHOD FOR PRODUCING A PRINTED CIRCUIT BOARD

(71) Applicant: NextGin Technology BV, Helmond (NL)

(72) Inventor: J. A. A. M. Tourne, Helmond (NL)

(73) Assignee: NextGin Technology BV, Helmond (NL)

(\*) Notice: Subject to any disclaimer, the term of this patent is extended or adjusted under 35 U.S.C. 154(b) by 0 days.

(21) Appl. No.: 15/048,510

(22) Filed: Feb. 19, 2016

(65) Prior Publication Data

US 2016/0249458 A1 Aug. 25, 2016

Related U.S. Application Data

(60) Provisional application No. 62/118,740, filed on Feb. 20, 2015.

(51) Int. Cl.
| | |
|---|---|
| H01K 3/10 | (2006.01) |
| H05K 3/10 | (2006.01) |
| H05K 1/02 | (2006.01) |
| H05K 3/40 | (2006.01) |

(52) U.S. Cl.
CPC .......... *H05K 3/107* (2013.01); *H05K 1/0251* (2013.01); *H05K 3/403* (2013.01); *H05K 1/0298* (2013.01); *H05K 2201/09645* (2013.01); *H05K 2201/09854* (2013.01)

(58) Field of Classification Search
CPC ........ H05K 1/114; H05K 1/115; H05K 3/062; H05K 3/403; H05K 3/0047; H05K 3/42; H05K 2201/0959; H05K 2201/09645; H05K 2203/0207; H05K 2203/0242; Y10T 29/49165; Y10T 29/49155; Y10T 29/49126; Y10T 29/49128

USPC .......... 29/830, 832, 846, 847, 852; 174/256, 174/261, 262; 714/724
See application file for complete search history.

(56) References Cited

U.S. PATENT DOCUMENTS

| | | | |
|---|---|---|---|
| 3,400,210 A * | 9/1968 | Reimer ................. | H05K 1/115 174/266 |
| 4,543,715 A | 10/1985 | Iadarola et al. | |
| 6,137,064 A | 10/2000 | Kiani et al. | |
| 6,541,712 B1 | 4/2003 | Gately et al. | |
| 6,593,535 B2 | 7/2003 | Gailus | |
| 6,594,811 B2 | 7/2003 | Katz | |
| 6,891,272 B1 | 5/2005 | Fjelstad | |
| 7,275,316 B2 | 10/2007 | Myers et al. | |

(Continued)

FOREIGN PATENT DOCUMENTS

JP 2630308 B2 7/1997

OTHER PUBLICATIONS

PCT Search Report and Written Opinion for PCT/US2016/018682 mailed Jul. 12, 2016.

*Primary Examiner* — Donghai D Nguyen
(74) *Attorney, Agent, or Firm* — Dunlap Codding, P.C.

(57) ABSTRACT

A method for producing a printed circuit board is disclosed. In the method, a slot is formed in a substrate having at least three layers with the slot extending through at least two of the layers. The slot has a length and a width with the length being greater than the width. The sidewall of the substrate surrounding the slot is coated with a conductive layer. Then, the conductive layer is separated into at least two segments that are electrically isolated along the side wall of the substrate.

21 Claims, 22 Drawing Sheets

(56) References Cited

U.S. PATENT DOCUMENTS

| | | |
|---|---|---|
| 7,358,470 B2 | 4/2008 | Wang et al. |
| 7,378,601 B2 | 5/2008 | Hsu et al. |
| 7,457,132 B2 | 11/2008 | Gisin et al. |
| 7,470,864 B2 | 12/2008 | Ho et al. |
| 7,645,943 B2* | 1/2010 | Horiuchi ............ H05K 1/0263 174/261 |
| 7,750,249 B2* | 7/2010 | Takeda ............... H05K 1/0222 29/832 |
| 8,222,537 B2 | 7/2012 | Dudnikov, Jr. et al. |
| 8,541,884 B2 | 9/2013 | Conn et al. |
| 8,604,357 B2 | 12/2013 | Takeda |
| 8,674,489 B2 | 3/2014 | Bolis et al. |
| 8,715,006 B2 | 5/2014 | Jeon |
| 9,035,197 B2 | 5/2015 | Ao |
| 2005/0133251 A1 | 6/2005 | Chiu |
| 2005/0161255 A1 | 7/2005 | Takada |
| 2007/0017697 A1 | 1/2007 | Hsu |
| 2007/0033457 A1* | 2/2007 | Park ..................... H05K 1/115 714/724 |
| 2007/0089292 A1 | 4/2007 | Tourne et al. |
| 2007/0089902 A1 | 4/2007 | Tourne |
| 2012/0306597 A1 | 12/2012 | Kushta |

* cited by examiner

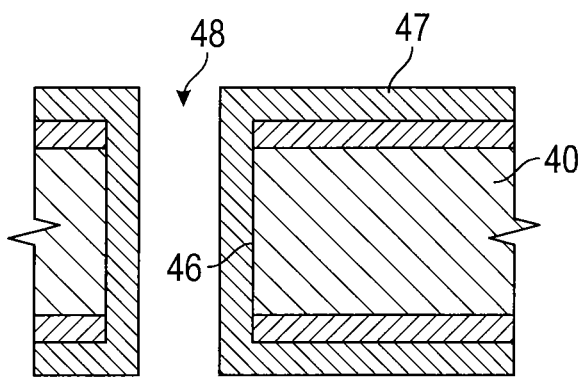
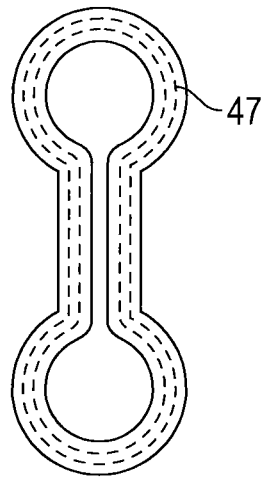
FIG. 2D
FIG. 2E
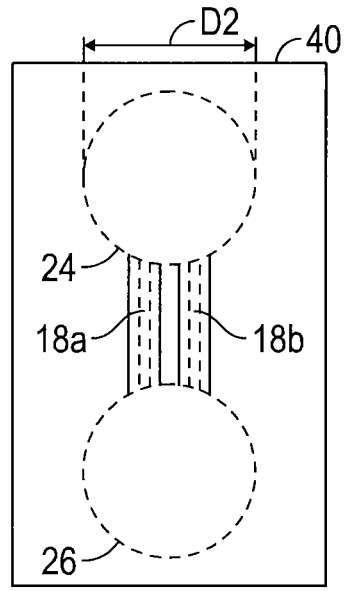
FIG. 2F
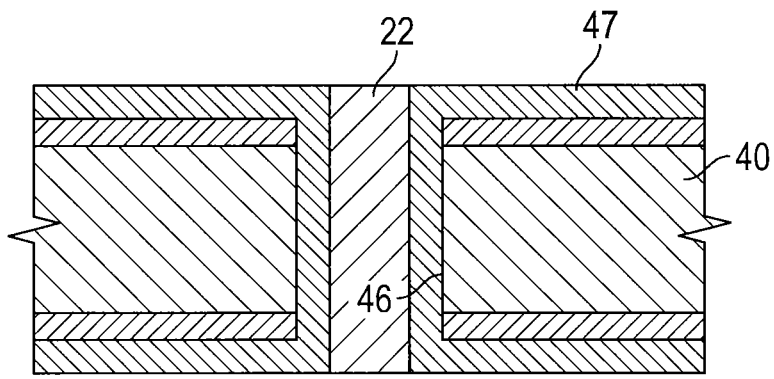
FIG. 2G

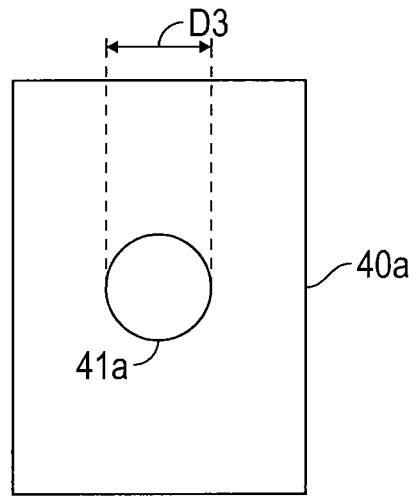 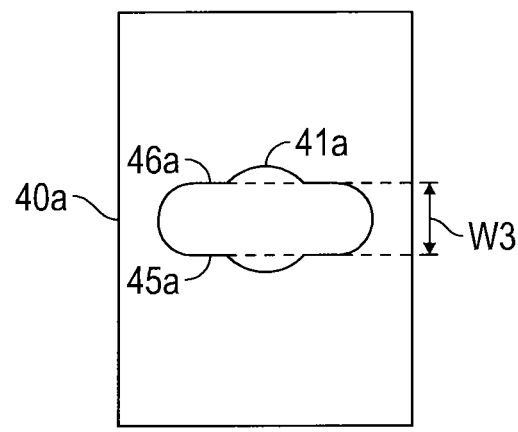
FIG. 4A  FIG. 4B
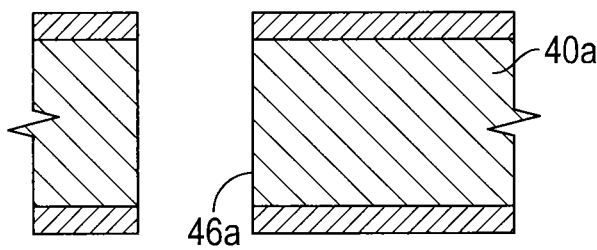
FIG. 4C
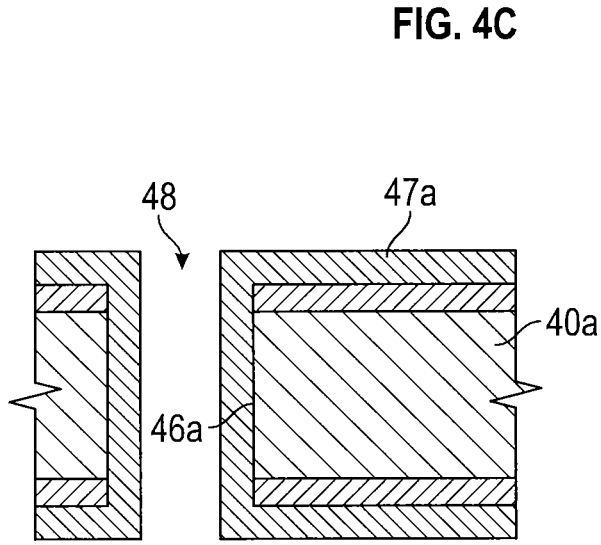 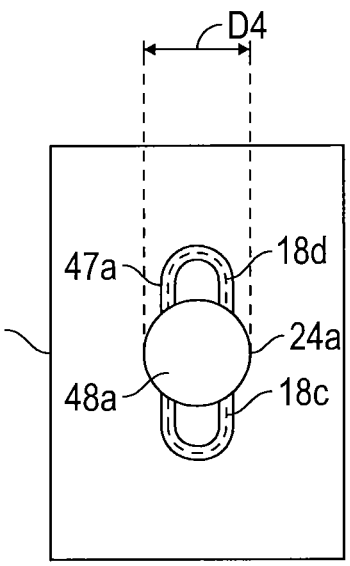
FIG. 4D  FIG. 4E

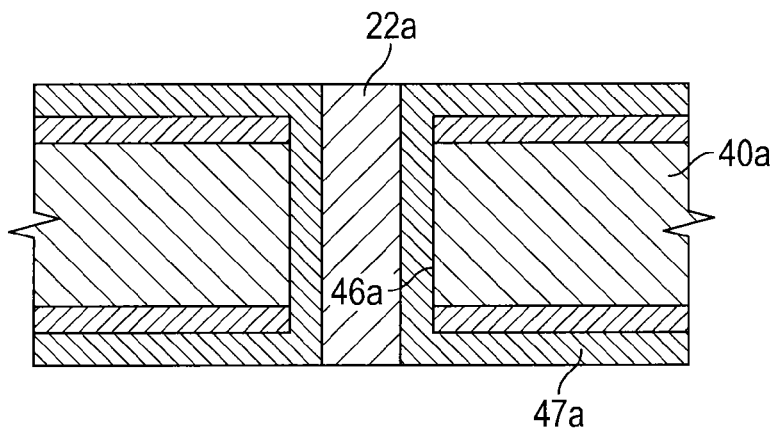
FIG. 4F
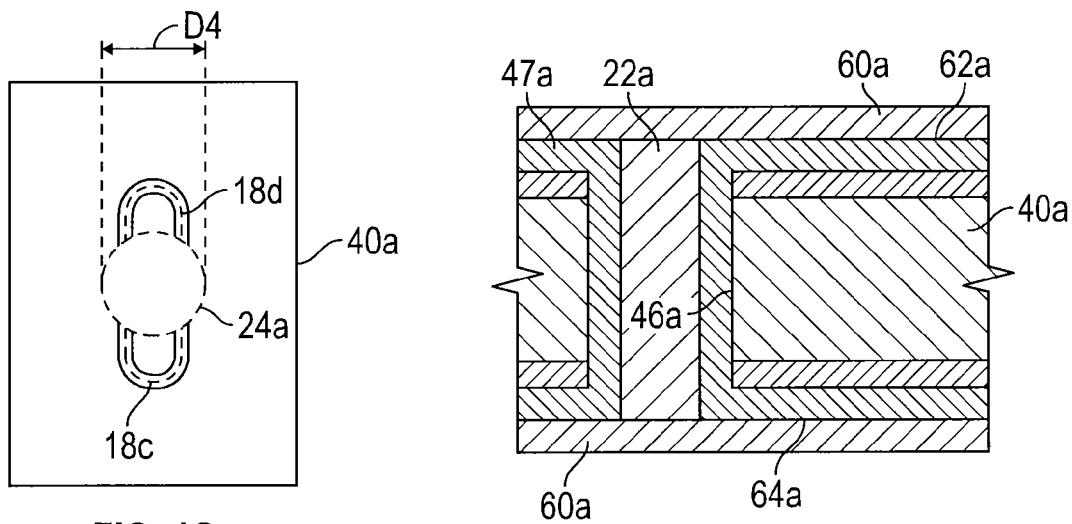
FIG. 4G
FIG. 4H
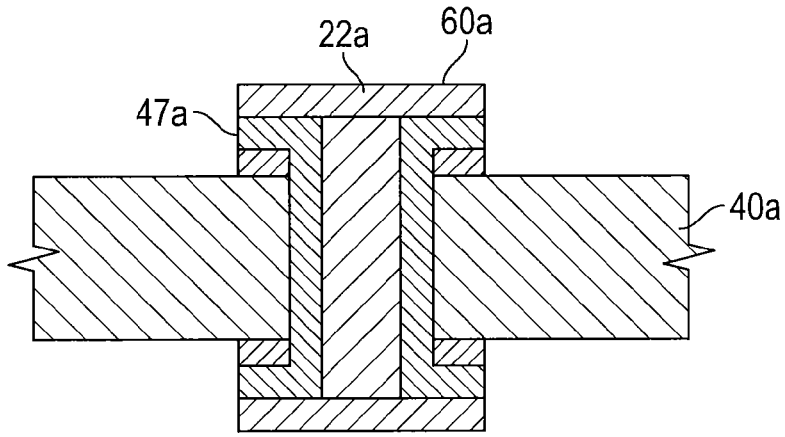
FIG. 4I

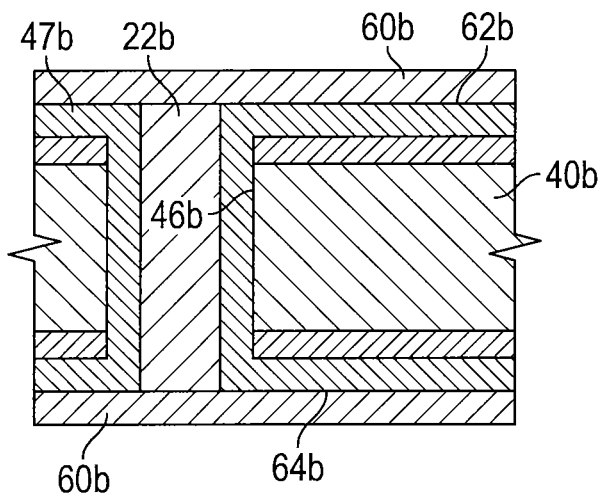
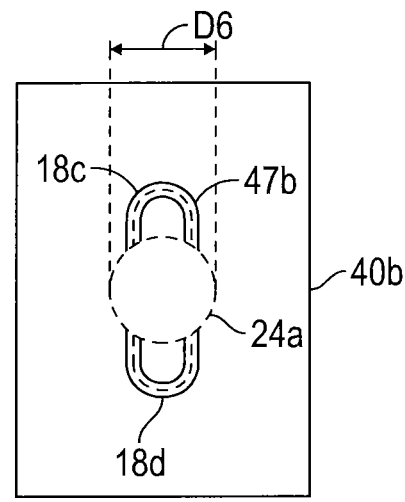
FIG. 5F          FIG. 5G
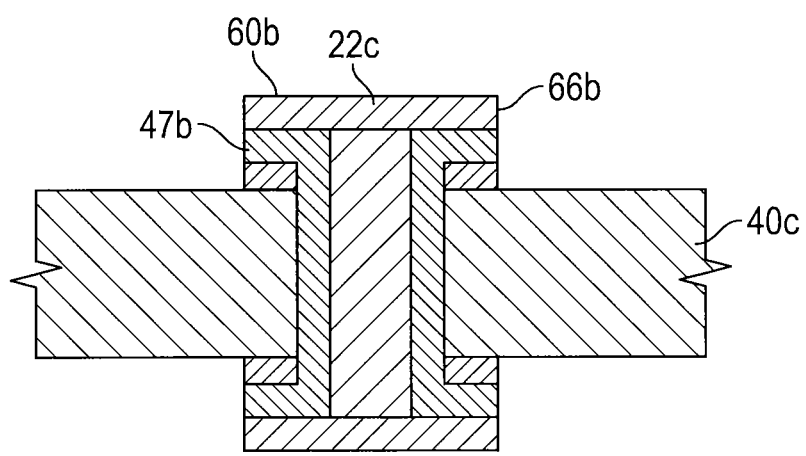
FIG. 5H

METHOD FOR PRODUCING A PRINTED CIRCUIT BOARD

INCORPORATION BY REFERENCE

The entire provisional patent application filed on Feb. 20, 2015 and identified by U.S. Ser. No. 62/118,740 is hereby incorporated herein by reference.

BACKGROUND

Printed circuit boards (PCBs) are widely known in the art and are used for forming a wide variety of types of electrical devices. Printed circuit boards typically consist of a number of layers of copper conductors which are interconnected by metallized holes. The metallized holes can be in different forms, such as microvias, buried vias, blind vias and through-holes. In the typical cases, the hole has a single function: the plating in the hole connects all copper layers exposed in the hole to each other, or the hole is used for component insertion.

Vias have also served dual purposes such as providing layer-to-layer interconnection and through-hole component mounts. The growth of surface mount component technology however, has reduced the need to utilize holes for through-hole component mount and has resulted in the via primarily providing layer-to-layer interconnection, i.e., a via hole.

There has, however, been a trend to provide PCBs having increasingly higher circuit density and higher circuit speed. Many of these designs have a few dense high Input/Output components grouped together. Thus, many PCB will have a very dense area around the high Input/Output components, while the remainder of the PCB is often of lower density. These very dense areas cause an increased layer count in the PCB resulting in an increased cost of the PCB.

To help meet the demand for increased circuit density, it has been proposed to provide more than one independent signal path or connection in a single via. However, there are limitations with vias. The surface area of vias are too large for the new generations of components and pushing the limits down in hole size cause yield issues in the drilling, cleaning, and plating of the vias. Thus, a need exists for a structure with a reduced surface area having electrically isolated segments. It is to such an improved method of producing PCBs that the present invention is directed.

BRIEF DESCRIPTION OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings:

FIGS. 2A, 2B, 2C, 2D, 2E, 2F, 2G, 2H, and 2I illustrate sequential steps utilized in one method of forming the printed circuit board depicted in FIG. 1.

FIGS. 4A, 4B, 4C, 4D, 4E, 4F, 4G, 4H and 4I illustrate exemplary sequential steps utilized in forming the printed circuit board depicted in FIG. 3.

FIGS. 5A, 5B, 5C, 5D, 5E, 5F, 5G and 5H illustrate the sequential steps utilized in yet another method of forming the printed circuit board depicted in FIG. 3.

DETAILED DESCRIPTION

Figure 1:
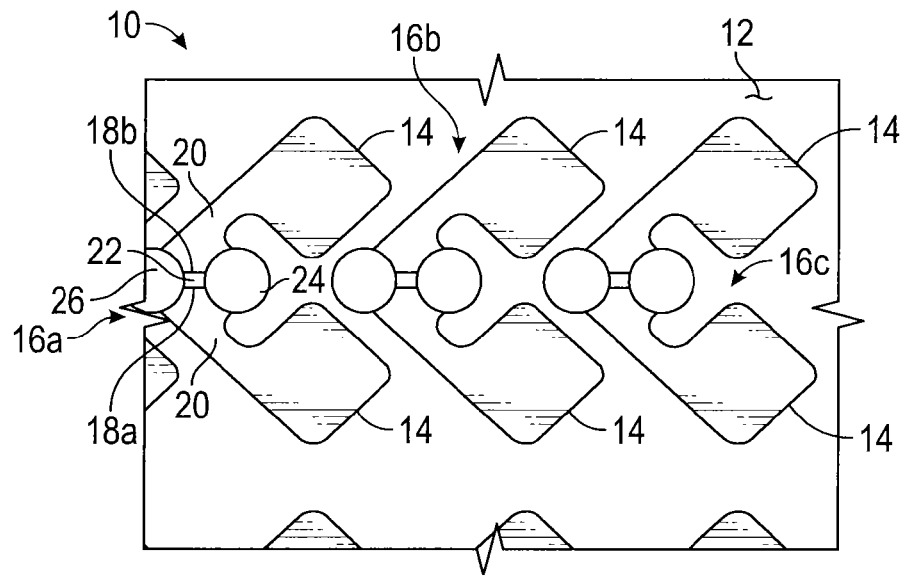
FIG. 1 is a top plan view of a portion of a printed circuit board constructed in accordance with the present invention.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. The inventive concepts disclosed herein are capable of other embodiments, or of being practiced or carried out in various ways. Also, it is to be understood that the phraseology and terminology employed herein is for the purpose of description and should not be regarded as limiting the inventive concepts disclosed and claimed herein in any way.

In the following detailed description of embodiments of the inventive concepts, numerous specific details are set forth in order to provide a more thorough understanding of the inventive concepts. However, it will be apparent to one of ordinary skill in the art that the inventive concepts within the instant disclosure may be practiced without these specific details. In other instances, well-known features have not been described in detail to avoid unnecessarily complicating the instant disclosure.

As used herein, the terms "comprises," "comprising," "includes," "including," "has," "having," and any variations thereof, are intended to cover a non-exclusive inclusion. For example, a process, method, article, or apparatus that comprises a list of elements is not necessarily limited to only those elements, and may include other elements not expressly listed or inherently present therein.

Unless expressly stated to the contrary, "or" refers to an inclusive or and not to an exclusive or. For example, a condition A or B is satisfied by any one of the following: A is true (or present) and B is false (or not present). A is false (or not present) and B is true (or present), and both A and B is true (or present).

In addition, use of the "a" or "an" are employed to describe elements and components of the embodiments disclosed herein. This is done merely for convenience and to give a general sense of the inventive concepts. This description should be read to include one or at least one and the singular also includes the plural unless it is obvious that it is meant otherwise.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

The term "conductive material" as used herein refers to a type of material that allows the flow of electrical current in one or more directions. In metals such as copper or aluminum, the flow of electrical current occurs through movement of mobile charged particles called electrons. In other types of conductive material, the flow of electrical current occurs through movement of positive charges such as cationic electrolyte(s) of a battery, or movile protons of a proton conductor in a fuel cell. Examples of conductive materials include copper, aluminum, gold, silver, carbon, paladium, nickel, zinc and combinations thereof.

Referring now to the drawings, and in particular to FIG. 1, shown therein and designated by a general reference numeral 10, is a printed circuit board constructed in accordance with the present invention. The printed circuit board 10 is provided with a substrate 12, a plurality of contact pads 14, and a plurality of vertical conductive structures 16 (the vertical conductive structures 16 are designated in FIG. 1 by the reference numerals 16a, 16b, and 16c for purposes of clarity). Each of the vertical conductive structures 16a, 16b, and 16c are similar in construction and function. Thus, only the vertical conductive structure 16a will be described in detail herein. The vertical conductive structure 16a is provided with at least two electrically isolated conductive segments 18a and 18b. Each of the conductive segments 18a and 18b is connected to a separate contact pad 14 by way of a trace 20, although the conductive segments 18a and 18b can be connected directly to the contact pads 14. The conductive segments 18a and 18b are electrically isolated by a non-conductive filling material 22 interposed between the conductive segments 18a and 18b. As will be discussed in more detail below, the conductive segments 18a and 18b are typically formed by conductive plating which has been separated or cut by the formation of at least two spaced-apart holes 24 and 26 (which may be referred to herein as a first hole 24 and a second hole 26).

The substrate 12 can be any material or device capable of being utilized to support electrical components, conductors, and the like. In one preferred embodiment, the substrate 12 includes multiple layers of interleaved conductive paths (or traces) and insulators.

The contact pads 14 can be any type of material or device capable of providing an electrical connection or contact to an external component, such as an integrated circuit. For example, the contact pad 14 can be a surface mount contact, or a ball grid array contact, or solder mask defined common mode contact. This shape can be in the form of round, oval, or multi-sided shapes depending on the optimum routing and bonding criteria.

The vertical conductive structure (V.C.S.) 16a, for example can be used to transfer various types of signals, including differential or common mode type signals. Exemplary types of signals include analog signals, digital signals, fixed voltage signals, or a power ground. In certain instances, pairs of the conductive segments 18 may be used together to convey a differential or common mode signal. In the case of differential type signals the path or running two signals in parallel would with traditional technology be distorted as the vias separate the signal. In the case of the vertical conductive structure 16 the signals/traces stay close together and have a minimum distortion of the signal. With matching dielectric fill materials the coupling effects can simulate a broadside coupled circuit. This is in combination with the signal impedance on the inner layers and outer layers can potentially dramatically reduce the effects of via stub influence for inductance and capacitance. Stub reduction in a Z direction of the vertical conductive structure, using control depth drilling or blind via structures will further reduce the influence of the vertical conductive structure 16a compared to conventional single signal through hole vias. An example of a system for stub reduction in the Z direction of the via is disclosed is U.S. Ser. No. 10/944,583 filed on Sep. 17, 2004, the entire content of which is hereby incorporated herein by reference.

Typical drill sizes for the through holes and buried holes are in the range of 0.35 mm to 0.2 mm and the current trend in the field of producing printed circuit boards is to lower the drill sizes even further to accommodate smaller pin pitches in new generation components. Further, the current trend in the field of producing printed circuit boards is to increase a layer count within the printed circuit boards due to ever increasing I/O count, which results in the printed circuit boards getting thicker. Thicker printed circuit boards in combination with smaller holes results in lower yield processes with conventional printed circuit board manufacturing technologies. A ratio of the PCB thickness versus drill size is known in the art as an aspect ratio. When using aspect ratios greater than 12, conventional printed circuit board manufacturing processes have difficulty plating the vias. If we compare, however, the surface area of a through hole via constructed in accordance with conventional printed circuit board manufacturing processes with a surface area of the vertical conductive structure 16 then we see a large difference in A/R (by surface area), which shows one advantage of the vertical conductive structure 16.

| Through hole | Board thickness [mm] | Drill/VCS size [mm] | Surface area [mm²] | A/R By diameter | A/R by surface area |
|---|---|---|---|---|---|
|  | 3.0 | 0.25 | 0.049 | 12 | 61.1 |
|  | 3.0 | 0.2 | 0.0314 | 15 | 95.5 |
| VCS | 3.0 | 0.35 × 1.0 | 0.323 | * | 9.3 |
|  | 3.0 | 0.25 × 0.8 | 0.187 | * | 16.1 |

* There is no diameter for the VCS element and therefore the A/R by diameter cannot be calculated for a comparison with a through hole therefore we take the surface area as a comparison.

In practice the vertical conductive structure 16 may be longer than listed in the table above in order to hold more conductive elements. This will result in even a higher surface area making the plating easier, which again results in less complex plating systems and higher yield reducing the total cost.

The conductive segments 18a and 18b can be constructed of any type of conductive material which is suitable for providing the electrical connection between an internal trace or conductive path, and another internal or external conductive path or trace, with or without external contact pads. Typically, the conductive segments 18a and 18b will be constructed of copper. However, it should be understood that other materials and/or alloys of materials and or combinations of different materials can be utilized in forming the conductive segments 18a and 18b.

The traces 20 are constructed of a conductive material, such as gold or copper.

The filling material 22 is optional, but may be helpful when space is an issue as the filling material 22 permits the contact pads 14 to be positioned over the conductive segments 18a and 18b. The filling material 22 when used acts as a dielectric between the two conductive segments 18a and 18b. The dielectric between the two conductive segments 18a and 18b can be adjusted by varying the size of a channel or slot connecting the holes 24 and 26 or modifying the material forming the filling material 22.

The filling material 22 may be formed of a material having chemical and thermal compatibility with the substrate 12 fabrication processes and materials and is desirably compatible with the various plating baths employed. Also, the filling material 22 should exhibit sufficient flow characteristics in order to fill small aspect ratio plated through-holes (or blind holes) and have the ability to be transformed, cured or converted into a solid material, with a minimal volume change after filling. The thermal expansion of the filling material 22 should be compatible with the rest of the substrate 12. Furthermore, the filling material 22 should exhibit good adhesion to the conductive segments 18.

Figures 2A, 2B:
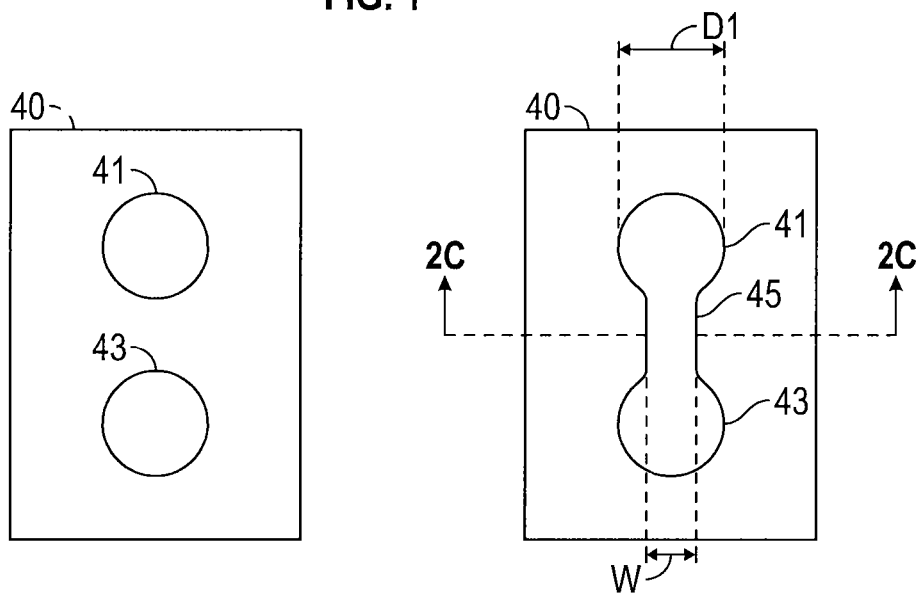

Referring now to FIGS. 2A-2I, the sequential steps followed to accurately form the vertical conductive structures 16a, 16b and 16c in the substrate 12 will be described. FIG. 2a shows an insulator substrate 40, such as a printed circuit board or a flexible thin-film substrate. Two spatially disposed holes 41 and 43 are formed in the insulator substrate 40 at a desired position, as shown in FIG. 2a and desired angle relative to an upper surface of the insulator substrate 40. For example, the holes 41 and 43 may be formed at an angle substantially normal to the upper surface of the insulator substrate 40. The holes 41 and 43 include a diameter D1, which may be the same or different for each of the holes 41 and 43. The holes 41 and 43 may be formed through the use of a drilling method, but any conventional method, such as milling, punching, laser drilling, water cutting, or photo-definition, can be used. The diameter D1 of the holes 41 and 43 can be any size that is compatible with the other design requirements of the insulator substrate 40. In an embodiment, the diameter D1 of holes 41 and 43 may be in a range between about 0.05 millimeters and about 0.5 millimeters. In some embodiments, the diameter D1 of holes 41 and 43 may be in a range between about 0.1 millimeters and about 0.5 millimeters. The space between the holes 41 and 43 may be between 0.1 millimeters and 0.5 millimeters apart or smaller or bigger, depending upon the accuracy of processing. All or substantially all of the openings or holes in the insulator substrate 40 may be formed at the same time, whether the openings or holes are ultimately to be formed into the vertical conductive structure 16, as described below, or not. This avoids misregistration, especially from tolerance buildups, that can occur between the separate hole forming processes and the subsequently formed wiring patterns that are formed by the use of one or more masks that must be registered with the vertical conductive structure 16. This factor is especially important as a printed circuit boards' wiring patterns become finer and denser.

Figure 2C:
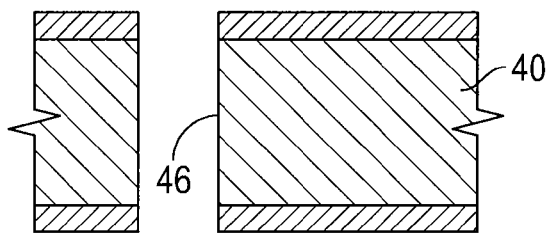

Thereafter, as shown in FIGS. 2B and 2C, at least a portion of the material between the holes 41 and 43 is removed by formation of a slot 45 in the substrate 40. FIG. 2C is a partial cross-sectional view taken along the lines 2C-2C in FIG. 2B. The slot 45 may have a width W less than the diameter D1 of the two spatially disposed holes 41 and 43. However, the width W of the slot 45 and the diameter D1 of the two spatially disposed holes 41 and 43 may be the same. In an embodiment, the diameter D1 of the two spatially disposed holes 41 and 43 may be smaller than the width W of the slot 45 and could be used as pilot holes. The slot 45 intersects the two spatially disposed holes 41 and 43 in such a way that a sidewall 46 is formed with a dog-bone shaped perimeter, for example. The slot 45 may be formed by the use of a drilling method, but any conventional method, such as routing, milling, punching, laser drilling/cutting/ablation, water cutting, or photo-definition, can be used.

Thereafter, as shown in the cross-sectional view of FIG. 2D and the top plan view of FIG. 2E, a conductive seed layer (not shown) is added followed by the addition of a conductive layer 47 of a first conductive material being deposited on the surfaces of the substrate 40 and sidewall 46 to leave an opening in the substrate 40 surrounded by the conductive layer 47. In an embodiment, the first conductive material is copper and may be deposited to a thickness in the range between about 2.54 micron and about 25 microns, to a thickness of >approximately 5 microns, and to a thickness of approximately 15-25 microns. For a through structure, the thickness may be in a range from about 20 to 25 micron and for a blind structure, the thickness may be about 15 micron, for example. The conductive layer 47 on the sidewall 46 may be thick enough to provide a robust mechanical structure that will survive the thermal fluctuations and aggressive handling experienced by a printed circuit board during subsequent component assembly and usage.

In an embodiment, an electrolytic plating process is used to deposit the conductive layer 47. The electrolytic process may follow a surface preparation step involving either a direct metallization process or an electroless process. The surface preparation step includes depositing a thin conductive seed layer that sensitizes the surface and assists in the adhesion of the conductive layer 47 to the sidewalls 46. Direct metallization comprises depositing a thin conductive molecular layer (not shown) on the substrate surfaces and the vertical conductive structure sidewall 46 prior to depositing the conductive layer 47. The conductive layer 47 may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the substrate 40 and the sidewalls 46 prior to depositing the conductive layer 47, to a thickness in the range between about 30 microns and about 200 microns, and in an embodiment, to a thickness in the range between about 70 microns and about 80 microns.

The surface preparation followed by the electrolytic deposition may result in a non-linear distribution of the conductive layer 47 on the sidewall 46 due to a natural tendency for the thickness of the conductive layer 47 to reduce as a depth of the sidewall 46 increases.

Then, as illustrated in FIG. 2F, the first and second holes 24 and 26 are formed in the substrate 40 with each hole 24 and 26 overlapping the sidewall 46 and the conductive layer 47. Each hole 24 and 26 removes a portion of the conductive layer 47 on the sidewall 46 so that the holes 24 and 26 cooperate to form the electrically isolated segments 18a and 18b from the conductive layer 47. The first and second holes 24 and 26 may be concentric with the holes 24 and 26, but include a diameter D2 that is preferably larger than the diameter D1 of the holes 41 and 43. When drilling, using a bit having a diameter D2 that is larger than the diameter D1 permits the bit to be substantially equally supported by the substrate 40 to assist in preventing lateral deflection of the bit during drilling as the conductive layer 47 is removed and without having to fill the void surrounded by the conductive layer 47 with a filler material prior to drilling.

After the first and second holes 24 and 26 are formed in the substrate 40, as illustrated in FIG. 2G, the filling material 22 (which is optional because air serves as a dielectric) may be introduced into a cavity 48 formed by substrate 40 and the electrically isolated segments 18a and 18b. The filling material 22 can be introduced into the cavity 48 by way of any suitable process. For example, the filling material 22 can be introduced into the cavity 48 by way of a squeegee with or without a pattern or stencil or screen. Other manners of introducing the filling material 22 into the cavity 48 may also be used, such as rollers, a pressurized head introducing a pressurized supply of the filling material 22 into the cavity 48, a syringe having a needle inserted into the cavity 48, inkjet printing, or any other manner capable of filling the cavity 48 with the filling material 22. The filling material 22 may be positioned within the cavity 48, so as to avoid the formation of bubbles or pits.

If the filling material 22 is introduced into the cavity 48, and the filling material 22 has cured, the substrate 40 may be planarized employing an abrasive, brush, or other type of planing device so that an outer end of the filling material 22 is substantially coplanar with an outer surface of the conductive layer 47.

Figure 2H:
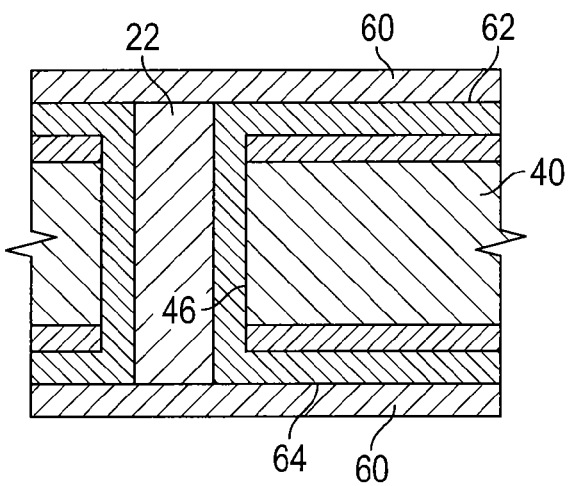
Figure 2I:
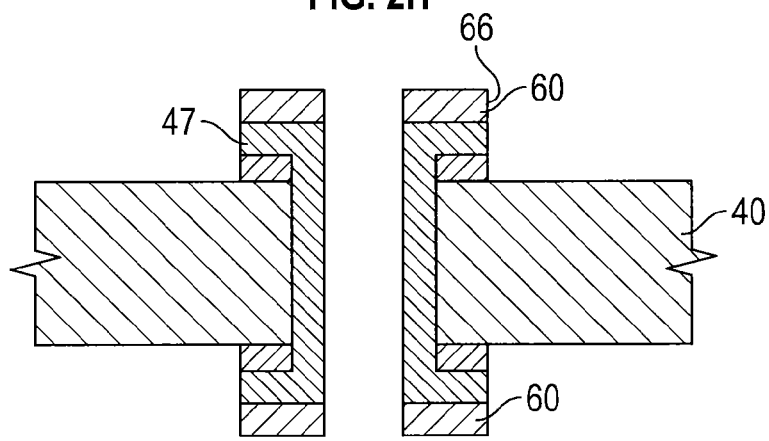

One or more pattern plates 60 are then provided on a first surface 62, and/or a second surface 64 of the substrate 40 as shown in FIG. 2H. The one or more pattern plates 60 include a second conductive layer when plating on the surface of the cured filling material 22 and the electrically isolated segments 18a and 18b. This would be required when the surface mount contact area overlaps into the areas of the substrate 40 having the cured filling material 22 and the electrically isolated segments 18a and 18b. Once this area is plated to the optimum thickness, the substrate 40 is passed through a (image definition process typical called a Strip Etch Strip (Sn is typical used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60, and also portions of the layer 47 as shown in FIG. 2I and the base copper from the laminate/copper foil.

Then, the substrate 40 may be finished with a solder mask, surface finish, such as ENIG, and the like to produce the printed circuit board 10. The solder mask can be any suitable solder mask, such as a glossy type version.

Figure 3:
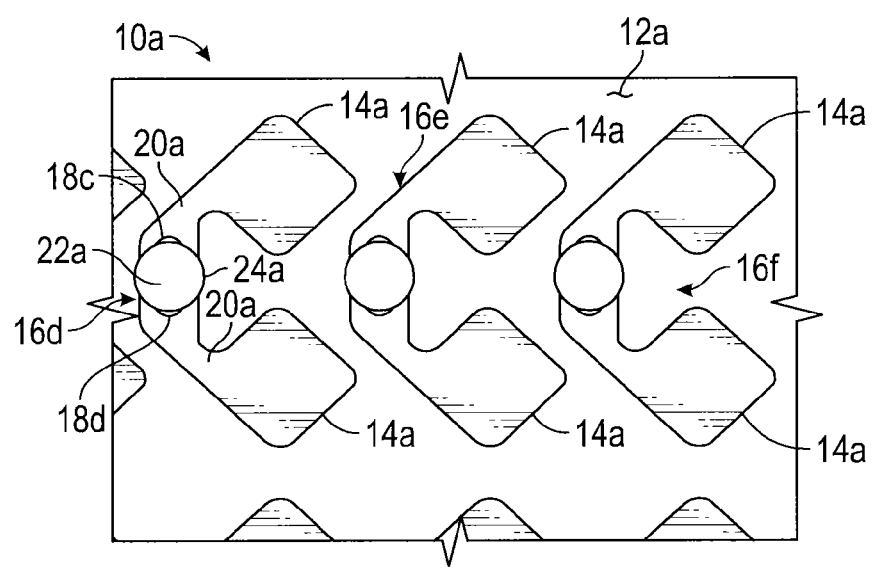
FIG. 3 is a top plan view of a portion of a printed circuit board constructed in accordance with the present invention.

Referring now to FIG. 3, shown therein and designated by a general reference numeral 10a, is a second embodiment of a printed circuit board constructed in accordance with the present invention. The printed circuit board 10a is provided with a substrate 12a, a plurality of contact pads 14a, and a plurality of vertical conductive structures 16 (the vertical conductive structures 16 are designated in FIG. 1 by the reference numerals 16d, 16e, and 16f for purposes of clarity). Each of the vertical conductive structures 16d, 16e, and 16f are similar in construction and function. Thus, only the vertical conductive structure 16d will be described in detail herein. The vertical conductive structure 16d is provided with at least two electrically isolated conductive segments 18c and 18d. Each of the conductive segments 18c and 18d is connected to a separate contact pad 14a by way of a trace 20a, although the conductive segments 18c and 18d can be connected directly to the contact pads 14a. The conductive segments 18c and 18d are electrically isolated by a filling material 22a (non-conductive) interposed between the conductive segments 18c and 18d. As will be discussed in more detail below, the conductive segments 18c and 18d are typically formed by conductive plating which has been separated or cut by the formation of at least one hole 24a.

The substrate 12a can be any material or device capable of being utilized to support electrical components, conductors, and the like. In one preferred embodiment, the substrate 12a includes multiple layers of interleaved conductive paths (or traces) and insulators.

The contact pads 14a can be any type of material or device capable of providing an electrical connection or contact to an external component, such as an integrated circuit. For example, the contact pad 14a can be a surface mount contact, or a ball grid array contact, or solder mask defined common mode contact. This shape can be in the form of round, oval, or multi-sided shapes depending on the optimum routing and bonding criteria.

The vertical conductive structure (V.C.S.) 16d can be used to transfer a differential or common mode type signal where each of the conductive segments 18c and 18d is coupled to a different portion of the differential or common mode signal. In the case of differential type signals the path or running two signals in parallel would with traditional technology be distorted as the vias separate the signal. The following table shows exemplary values of an aspect ratio by surface area for the vertical conductive structure 16d.

| Through hole | Board thickness [mm] | Drill/VCS size [mm] | Surface area [mm²] | A/R By diameter | A/R by surface area |
|---|---|---|---|---|---|
|  | 3.0 | 0.25 | 0.049 | 12 | 61.1 |
|  | 3.0 | 0.2 | 0.0314 | 15 | 95.5 |
| VCS | 3.0 | 0.35 × 1.0 | 0.323 | * | 9.3 |
|  | 3.0 | 0.25 × 0.8 | 0.187 | * | 16.1 |

* There is no diameter for the VCS element and therefore the A/R by diameter cannot be calculated for a comparison with a through hole therefore we take the surface area as a comparison.

In practice the vertical conductive structure 16d may be longer than listed in the table above in order to hold more conductive elements. This will result in even a higher surface area making the plating easier, which again results in less complex plating systems and higher yield reducing the total cost.

The conductive segments 18c and 18d can be constructed of any type of conductive material which is suitable for providing the electrical connection between an internal trace or conductive path, and another internal or external conductive path or trace, with or without external contact pads. Typically, the conductive segments 18c and 18d will be constructed of copper. However, it should be understood that other materials and/or alloys of materials and or combinations of different materials can be utilized in forming the conductive segments 18c and 18d.

The traces 20a are constructed of a conductive material, such as gold or copper. Any conductive material can be used so long as the conductive material includes a resistance which is suitably low for the particular application of the traces 20a, and structurable to form the traces 20a. Further, the traces 20a may be constructed of a combination of conductive materials. For example, gold may be applied to an underlying material, such as copper and acts as a finish to protect the underlying material against corrosion.

The filling material 22a acts as a dielectric between the two conductive segments 18c and 18d. The dielectric between the two conductive segments 18c and 18d can be adjusted by varying the size of the hole 24a or modifying the material forming the filling material 22a.

The filling material 22a, which is optional, may be formed of a material having chemical and thermal compatibility with the substrate 12a fabrication processes and materials and is desirably compatible with the various plating baths employed. Also, the filling material 22a should exhibit sufficient flow characteristics in order to fill small aspect ratio plated through-holes (or blind holes) and have the ability to be transformed, cured or converted into a solid material, with a minimal volume change after filling. The thermal expansion of the filling material 22a should be compatible with the rest of the substrate 12a. Furthermore, the filling material 22a should exhibit good adhesion to the conductive segments 18c and 18d.

Two exemplary methods for fabricating the printed circuit board 10a will be described hereinafter.

Example 1

Referring now to FIGS. 4A-4I, one example of sequential steps followed to accurately form the vertical conductive structures 16d, 16e and 16f in the substrate 12a (shown in FIG. 3) will be described. FIG. 4A shows an insulator substrate 40a, such as a printed circuit board or a flexible thin-film substrate. At least one hole 41a is formed in the insulator substrate 40a at a desired position, as shown in FIG. 4A and desired angle relative to an upper surface of the insulator substrate 40a. For example, the hole 41a may be formed at an angle substantially normal to the upper surface of the insulator substrate 40a. The hole 41a includes a diameter D3. The hole 41a may be formed through the use of a drilling method, but any conventional method, such as milling, punching, laser drilling, water cutting, or photo-definition, can be used. The diameter D3 of the hole 41 can be any size that is compatible with the other design requirements of the insulator substrate 40a. In an embodiment, the diameter D3 of hole 41a may be in a range between about 0.1 millimeters and about 0.5 millimeters. All or substantially all of the openings or holes in the insulator substrate 40a may be formed at the same time, whether they are ultimately to be formed into the vertical conductive structure 16, as described below, or not. This avoids misregistration, especially from tolerance buildups, that can occur between the separate hole forming processes and the subsequently formed wiring patterns that are formed by the use of one or more masks that must be registered with the vertical conductive structure 16d. This factor is especially important as a printed circuit boards' wiring patterns become finer and denser.

Thereafter, as shown in FIGS. 4B and 4C, a slot 45a is formed in the substrate 40a with the hole 41a being used to move a bit into the substrate 40a, preferably without contacting the substrate 40a. The bit can then be reciprocated in a lateral direction to remove material outside of the confines of the hole 41a to form the slot 45a. The slot 45a has a width W3 less than the diameter D3 of the hole 41a. The slot 45a intersects the hole 41a in such a way that a sidewall 46a is formed with a perimeter. The slot 45a may be formed by the use of a routing method with a bit as described herein, but any conventional method, such as milling, punching, laser drilling/cutting/ablation, water cutting, or photo-definition, can be used.

Thereafter, as shown in FIG. 4D, a conductive seed layer (not shown) is added followed by the addition of a conductive layer 47a of a first conductive material being deposited on the surfaces of the substrate 40a and sidewall 46a to leave an opening in the substrate 40a surrounded by the conductive layer 47a. In an embodiment, the first conductive material is copper and may be deposited to a thickness in the range between about 2.54 microns and about 25 microns, to a thickness between 15 microns and 25 microns, or to a thickness of approximately 15 microns. The conductive layer 47a on the sidewall 46a may be sufficiently thick to provide a robust mechanical structure that will survive the thermal fluctuations and aggressive handling experienced by a printed circuit board during subsequent component assembly and usage. For a through structure, the thickness may be in a range from about 20 to 25 microns and for a blind structure, the thickness may be about 15 microns, for example.

In an embodiment, an electrolytic plating process is used to deposit the conductive layer 47a. The electrolytic process may follow a surface preparation step involving either a direct metallization process or an electroless process. The surface preparation step includes depositing a thin conductive seed layer that sensitizes the surface and assists in the adhesion of the conductive layer 47a to the sidewalls 46a. Direct metallization comprises depositing a thin conductive molecular layer (not shown) on the substrate surfaces and the sidewall 46a prior to depositing the conductive layer 47a. The conductive layer 47a may also be palladium or platinum. This process avoids the typical catalytically deposited copper, thereby rendering this device more economically feasible.

The electroless surface preparation process comprises depositing a thin seed conductive layer (not shown), which may be copper, on the surfaces of the substrate 40a and the sidewalls 46a prior to depositing the conductive layer 47a, to a thickness in the range between about 3 microns and about 20 microns, and in an embodiment, to a thickness in the range between about 70 microns and about 80 microns.

The surface preparation followed by the electrolytic deposition may result in a non-linear distribution of the conductive layer 47a on the sidewall 46a due to a natural tendency for the thickness of the conductive layer 47 to reduce as a depth of the sidewall 46a increases.

Then, as illustrated in FIG. 4E, the hole 24a is formed in the substrate 40a with the hole 24a concentric with the hole 41a and also overlapping the sidewall 46a and the conductive layer 47a. The hole 24a removes a portion of the conductive layer 47a on the sidewall 46a so that the hole 24a forms the electrically isolated segments 18c and 18d from the conductive layer 47a. The hole 24a may include a diameter D4 that is preferably larger than the diameter D3 of the hole 41a. When drilling, using a bit having a diameter D4 that is larger than the diameter D3 permits the bit to be substantially equally supported by the substrate 40a as the conductive layer 47a is removed to assist in preventing deflection of the bit during drilling and without having to fill the void surrounded by the conductive layer 47a with a filler material prior to drilling.

After the hole 24a is formed in the substrate 40a, as illustrated in FIG. 4F, the filling material 22a may be introduced into a cavity 48a formed by substrate 40a and the electrically isolated segments 18c and 18d. The filling material 22a can be introduced into the cavity 48a by way of any suitable process. For example, the filling material 22a can be introduced into the cavity 48a by way of a squeegee with or without a pattern or stencil or screen. Other manners of introducing the filling material 22a into the cavity 48a may also be used, such as rollers, a pressurized head introducing a pressurized supply of the filling material 22a into the cavity 48a, a syringe having a needle inserted into the cavity 48a, inkjet printing, or any other manner capable of filling the cavity 48a with the filling material 22a. The filling material 22a may be positioned within the cavity 48a, so as to avoid the formation of bubbles or pits.

Once the filling material 22a is introduced into the cavity 48a, and the filling material 22a has cured, the substrate 40a may be planarized employing an abrasive, brush, or other type of planing device so that an outer end of the filling material 22a is substantially coplanar with an outer surface of the conductive layer 47a.

One or more pattern plates 60a are then provided on a first surface 62a, or a second surface 64a of the substrate 40a as shown in FIGS. 4G and 4H. The one or more pattern plates (the pattern plate can be done as a panel plate or combination of both, this applies for all plating processes) 60a include a second conductive layer when plating on the surface of the cured filling material 22a and the electrically isolated segments 18c and 18d. This would be required when the surface mount contact area overlaps into the areas of the substrate 40a having the cured filling material 22a and the electrically isolated segments 18c and 18d. Once this area is plated to the optimum thickness, the substrate 40a is passed through an image definition process typically called a Strip Etch Strip ($S_n$ is typically used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60a, and also portions of the layer 47a as shown in FIG. 4I and the base copper from the laminate/copper foil.

Then, the substrate 40a may be finished with a solder mask, surface finish, such as ENIG, and the like to produce the printed circuit board 10a. The solder mask can be any suitable solder mask, such as a glossy type version.

Example 2

Figures 5A, 5B:
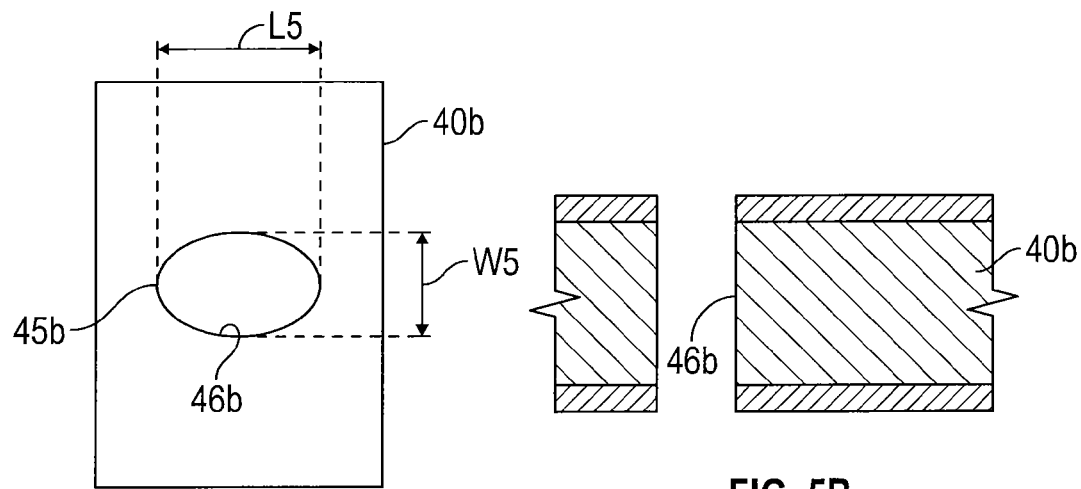

Referring now to FIGS. 5A-5I, another example of sequential steps followed to accurately form the vertical conductive structures 16d, 16e and 16f in the substrate 12a will be described. FIG. 5A shows an insulator substrate 40b, such as a printed circuit board or a flexible thin-film substrate. At least one slot 45b is formed in the insulator substrate 40b at a desired position, as shown in FIGS. 5A and 5B and desired angle relative to an upper surface of the insulator substrate 40b. For example, the slot 45b may be formed at an angle substantially normal to the upper surface of the insulator substrate 40b. The slot 45b is formed in the substrate 40b in such a way that a sidewall 46b is formed with a perimeter. The slot 45b includes a length L5 and a width W5. The slot 45b may be formed through the use of a milling method, but any conventional method, such as routing, punching, laser drilling, water cutting, or photo-definition, can be used. The length L5 and width W5 of slot 45b can be any size that is compatible with the other design requirements of the insulator substrate 40b. All or substantially all of the openings or holes in the insulator substrate 40b may be formed at the same time, whether they are ultimately to be formed into the vertical conductive structures 16d, 16e and 16f, as described below, or not. This avoids misregistration, especially from tolerance buildups, that can occur between the separate hole forming processes and the subsequently formed wiring patterns that are formed by the use of one or more masks that must be registered with the vertical conductive structure 16. This factor is especially important as a printed circuit boards' wiring patterns become finer and denser.

Figures 5C, 5D:
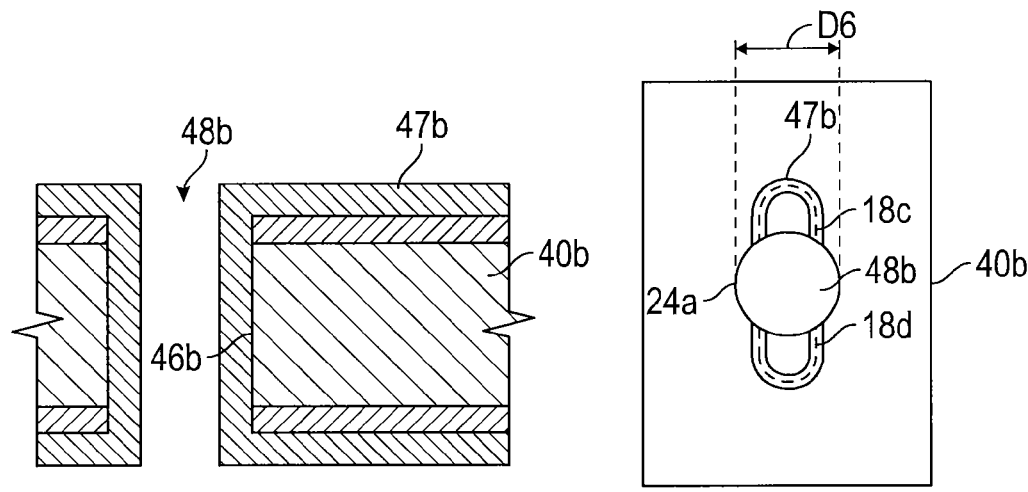

Thereafter, as shown in FIG. 5C, a conductive seed layer (not shown) is added followed by the addition of a conductive layer 47b of a first conductive material being deposited on the surfaces of the substrate 40b and sidewall 46b to leave an opening in the substrate 40b surrounded by the conductive layer 47b. In an embodiment, the first conductive material is copper and may be deposited to a thickness in the range between about 2.54 microns to about 25 microns, or to a thickness in the range of approximately 5 microns to approximately 25 microns, or to a thickness of approximately 15 microns. The conductive layer 47b on the sidewall 46b may be sufficiently thick to provide a robust mechanical structure that will survive the thermal fluctuations and aggressive handling experienced by a printed circuit board during subsequent component assembly and usage. As discussed above, for a through structure, the thickness may be in a range from about 20 to 25 microns and for a blind structure, the thickness may be about 15 microns, for example.

In an embodiment, an electrolytic plating process is used to deposit the conductive layer 47b. The electrolytic process may follow a surface preparation step involving either a direct metallization process or an electroless process. The surface preparation step includes depositing a thin conductive seed layer that sensitizes the surface and assists in the adhesion of the conductive layer 47b to the sidewalls 46b. Direct metallization comprises depositing a thin conductive molecular layer (not shown) on the substrate surfaces and the vertical conductive structure sidewall 46b prior to depositing the conductive layer 47b. The conductive layer 47b may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the substrate 40b and the sidewalls 46b prior to depositing the conductive layer 47b, to a thickness in the range between about 30 microns and about 200 microns, and in an embodiment, to a thickness in the range between about 70 microns and about 80 microns.

The surface preparation followed by the electrolytic deposition results in a highly linear distribution of the conductive layer 47b on the sidewall 46b.

Then, as illustrated in FIG. 5D, the hole 24a is formed in the substrate 40b with the hole 24a overlapping the sidewall 46b and the conductive layer 47b. The hole 24a removes a portion of the conductive layer 47b on the sidewall 46b so that the hole 24a forms the electrically isolated segments 18c and 18d from the conductive layer 47b. The hole 24a may include a diameter D6 that is preferably larger than the width W5 of the slot 45b. When drilling, using a bit having a diameter D6 that is larger than the width W5 permits the bit to be substantially equally supported by the substrate 40b while removing the conductive layer 47b to assist in preventing lateral deflection of the bit during drilling and without having to fill the void surrounded by the conductive layer 47b with a filler material prior to drilling.

Figure 5E:
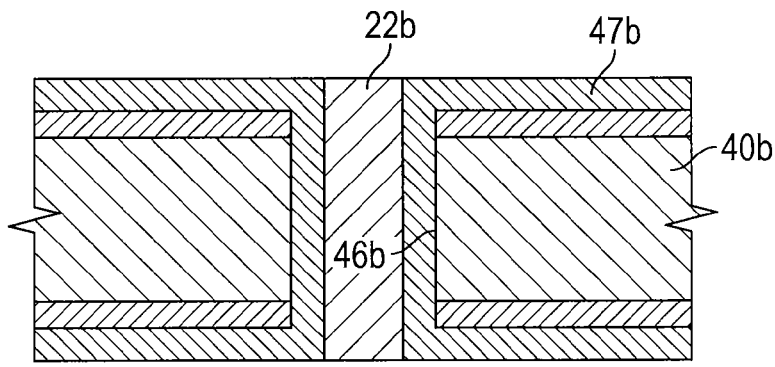

After the hole 24a is formed in the substrate 40b, as illustrated in FIG. 5E, a filling material 22b may be introduced into a cavity 48b formed by substrate 40b and the electrically isolated segments 18c and 18d. The filling material 22b can be introduced into the cavity 48b by way of any suitable process. For example, the filling material 22b can be introduced into the cavity 48b by way of a squeegee with or without a pattern or stencil or screen. Other manners of introducing the filling material 22b into the cavity 48b may also be used, such as rollers, a pressurized head introducing a pressurized supply of the filling material 22b into the cavity 48b, a syringe having a needle inserted into the cavity 48b, inkjet printing, or any other manner capable of filling the cavity 48b with the filling material 22b. The filling material 22b may be positioned within the cavity 48b, so as to avoid the formation of bubbles or pits.

Once the filling material 22b is introduced into the cavity 48b, and the filling material 22b has cured, the substrate 40b may be planarized employing an abrasive, brush, or other type of planing device so that an outer end of the filling material 22b is substantially coplanar with an outer surface of the conductive layer 47b.

One or more pattern plates 60b are then provided on a first surface 62b, or a second surface 64b of the substrate 40b as shown in FIGS. 5F and 5G. The one or more pattern plates 60b include a second conductive layer when plating on the surface of the cured filling material 22b and the electrically isolated segments 18c and 18d. This would be required when the surface mount contact area overlaps into the areas of the substrate 40b having the cured filling material 22b and the electrically isolated segments 18c and 18d. Once this area is plated to the optimum thickness, the substrate 40b is passed through a Strip Etch Strip ($S_n$ is typically used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60b, and also portions of the conductive layer 47b as shown in FIG. 5H. As shown in dashed lines in FIG. 5G, the conductive layer 47b on the sidewall 46b of the vertical conductive structure 42b, and a rim 66b formed by the conductive layer 47b defines a perimeter of the vertical conductive structure 42b.

Then, the substrate 40a may be finished with a solder mask, surface finish, such as ENIG, and the like to produce the printed circuit board 10a. The solder mask can be any suitable solder mask, such as a glossy type version.

Shown in FIGS. 6-16 are various examples of the substrate 12 having the vertical conductive structures 16, and traces 20 interconnected with selected ones of the conductive segments 18 of the vertical conductive structures. The FIGS. 6-16 are partial perspective views of examples of the substrate 12 and are not intended to show multiple views of the same example. FIGS. 6-16 are numbered to show generally where elements are located in the figures, but the same reference numeral, e.g., 16a, in FIGS. 6-16 is not intended to show the exact same element.

Figure 6:
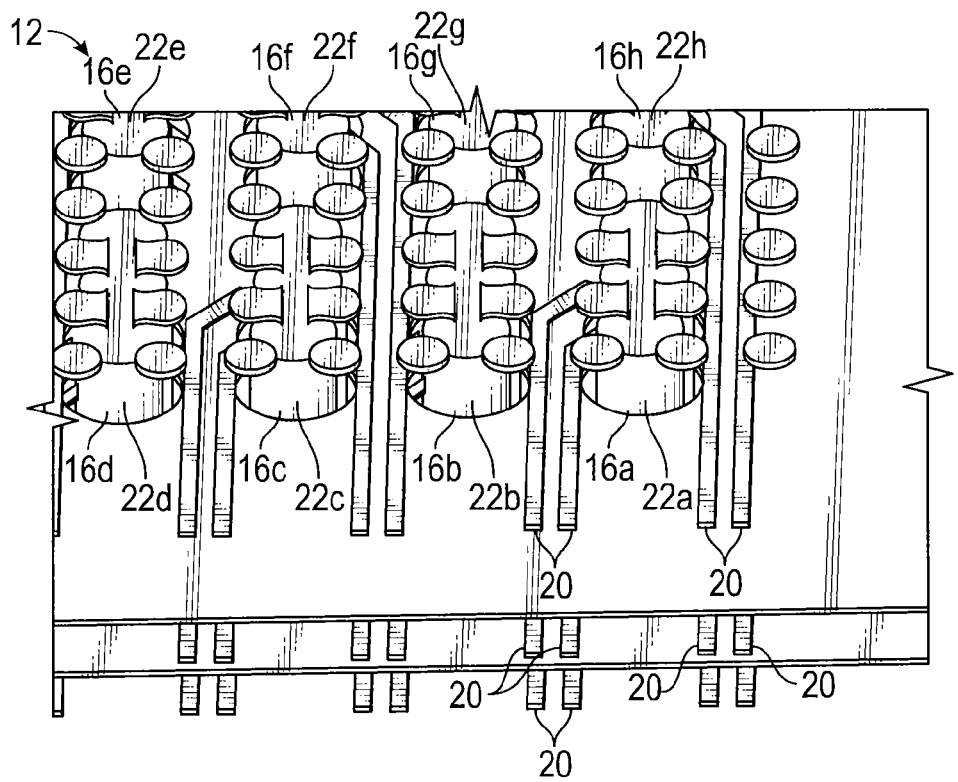
FIGS. 6-16 are various partial perspective views of exemplary substrates with vertical conductive structures constructed in accordance with the present disclosure.

FIG. 6 is a partial perspective view showing multiple VCS 16a-h extending vertically through multiple layers of an exemplary multi-layered substrate 12 and with electrically isolated conductive segments of the VCS 16a-h connected to traces 20 at three different layers (and without all of the traces being numbered for purposes of clarity). One skilled in the art will understand that the techniques disclosed herein for forming the multiple VCS 16a-h create more routing space under a BGA type component and more space for the traces 20 used to convey power and ground signals to be positioned directly underneath the BGA type component.

Figure 7:
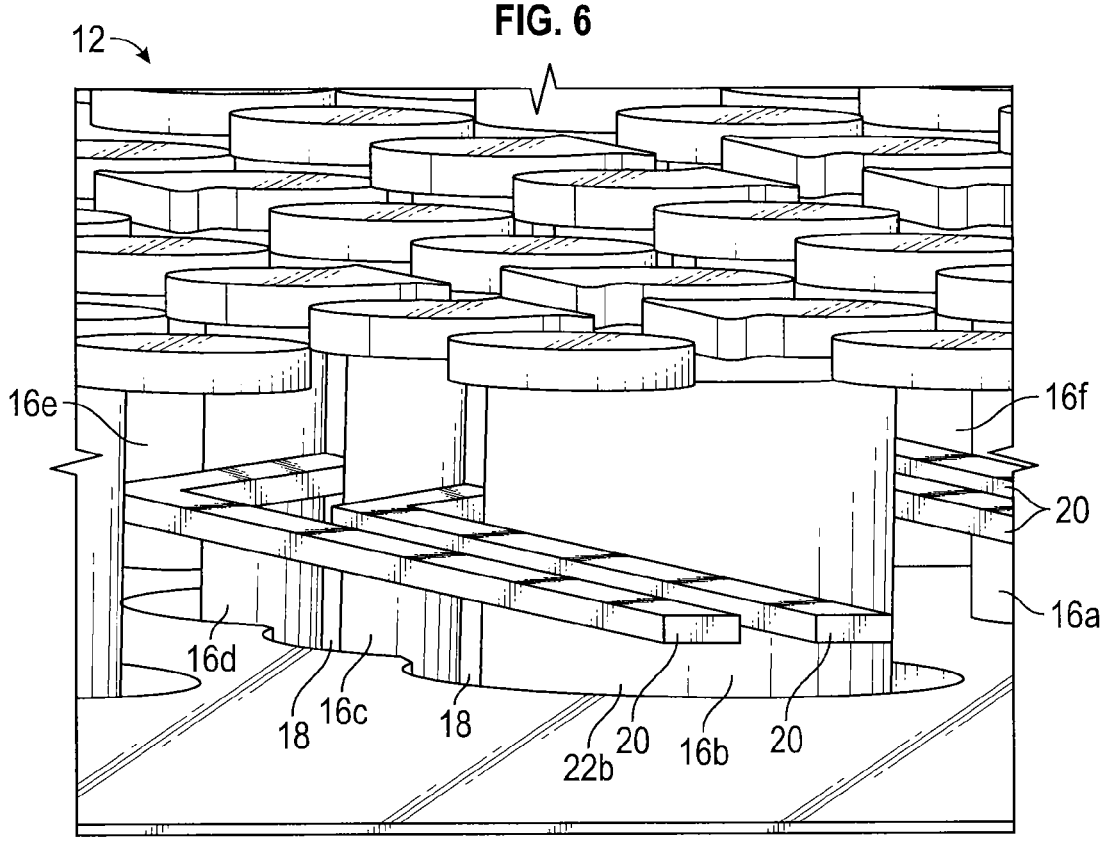

FIG. 7 is a partial perspective view of an exemplary multi-layered substrate 12 in which traces 20 extend through an interior layer of the substrate 12 from the VCS 16a-f.

Figure 8:
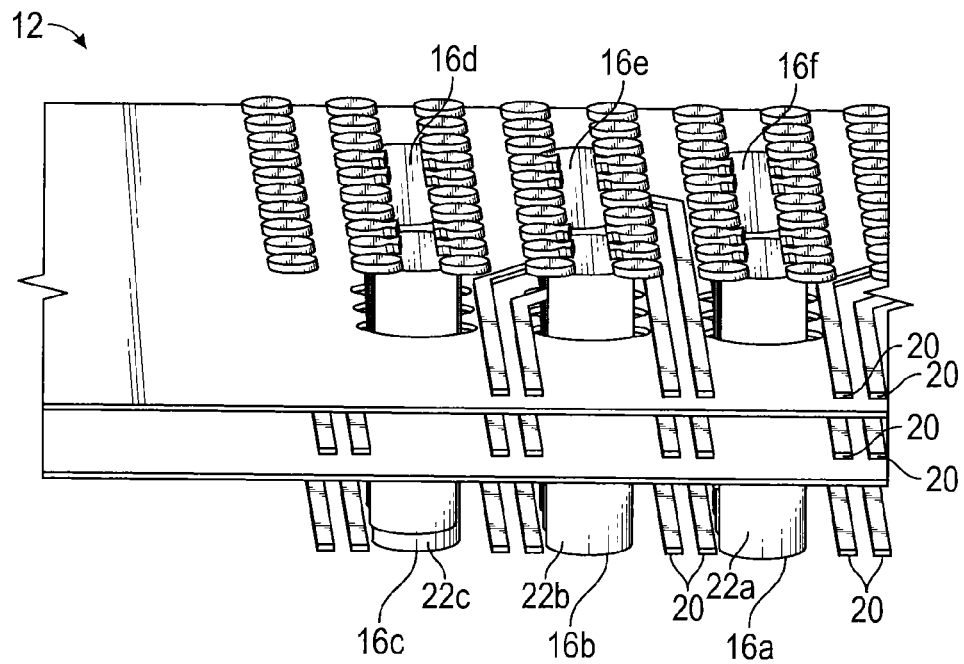

FIG. 8 is a partial perspective view of the substrate 12 showing a ball grid array with multiple VCS 16a-f having electrically isolated conductive segments connected to traces 20 and extending through multiple layers. The ball grid array of FIG. 8 can be a 0.5 mm ball grid array.

Figure 9:
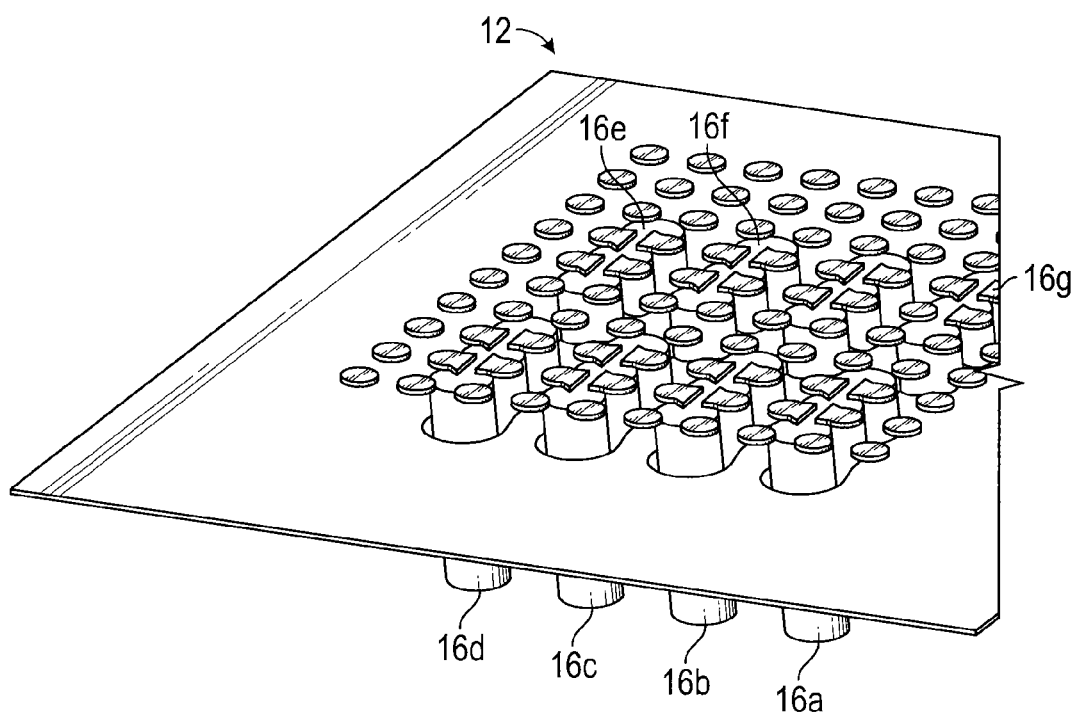

FIG. 9 is a partial perspective view of the substrate 12 showing a ball grid array shown on filling material 22 of six vertical conductive structures 16a-f with internal traces and multiple layers omitted. The ball grid array of FIG. 9 can be a 0.5 mm ball grid array.

Figure 10:
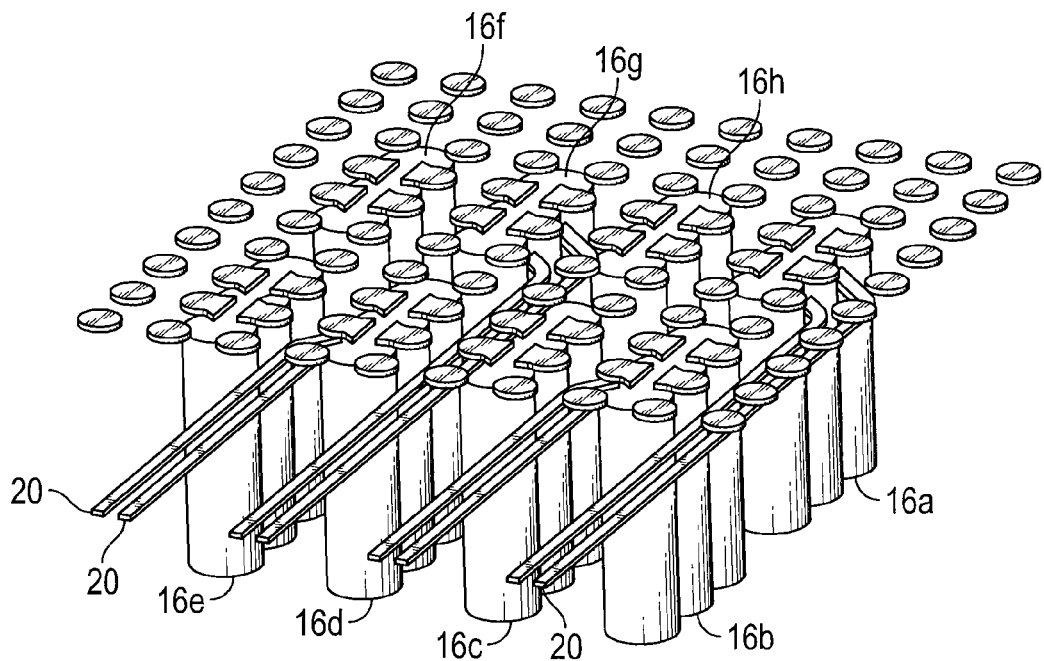

FIG. 10 is a partial perspective view of the substrate 12 showing traces 20 extending from multiple VCS 16a-h.

Figure 11:
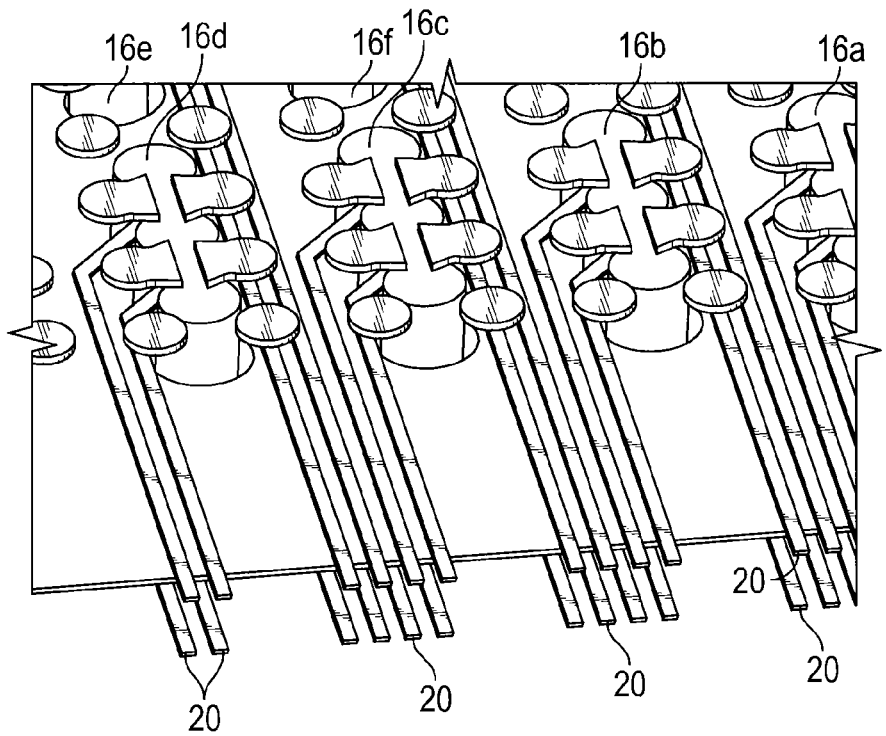

FIG. 11 is a partial perspective view of the substrate 12 showing traces 20 extending from VCS 16a-f at multiple layers.

Figure 12:
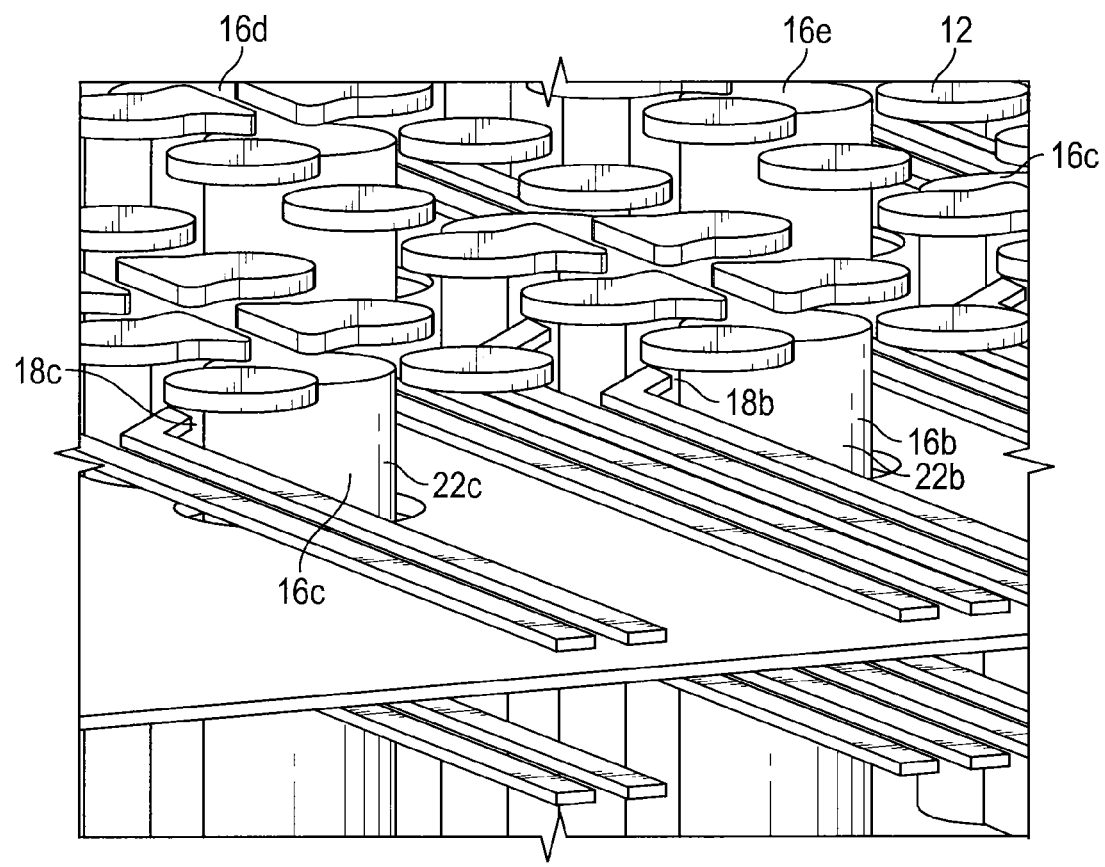

FIG. 12 is a partial perspective view of the substrate 12 having traces 20 extending from VCS 16a-f at multiple layers of the substrate 12.

Figure 13:
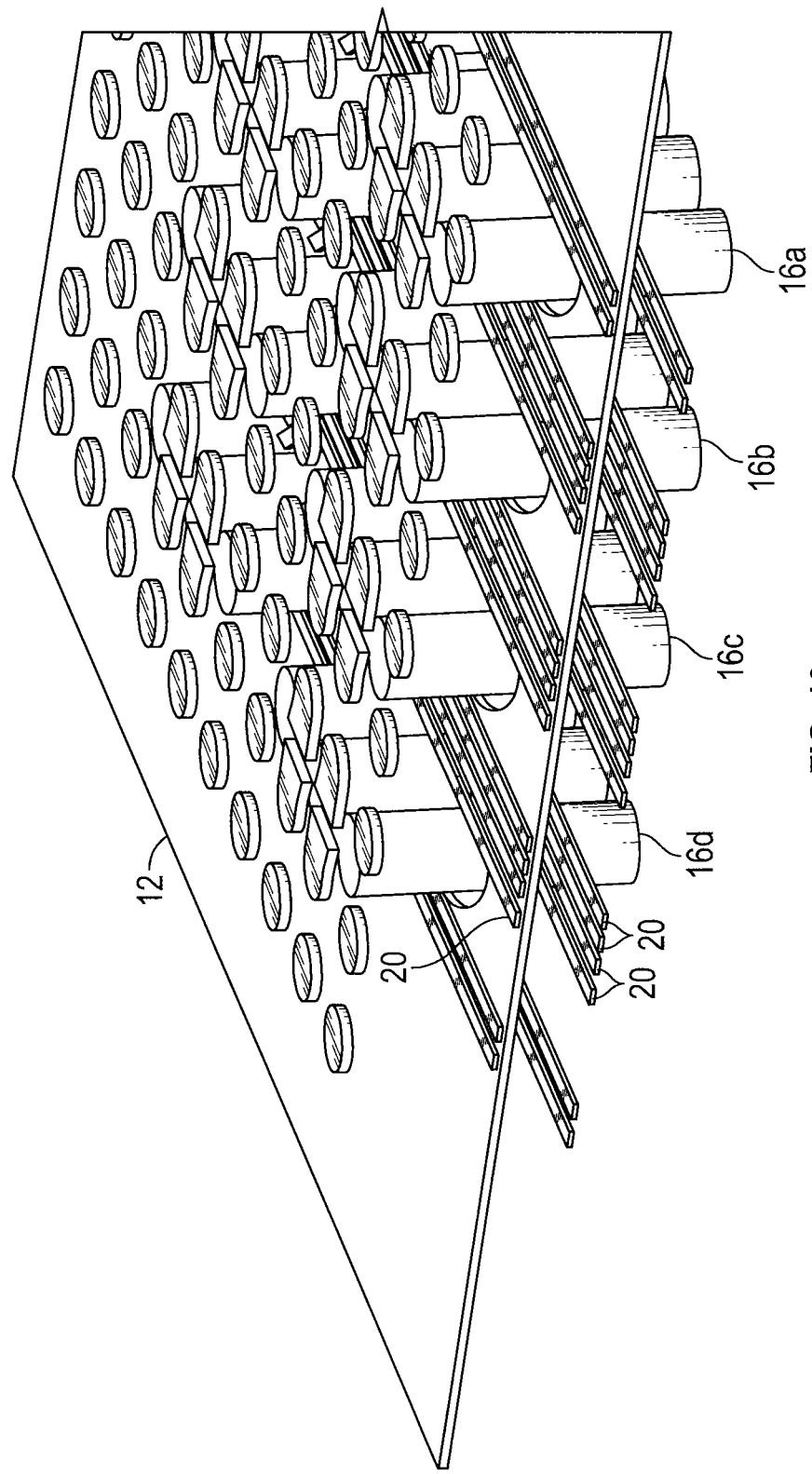

FIG. 13 is another partial perspective view of the substrate 12 having traces electrically connected and extending from VCS 16a-d at multiple layers.

Figure 14:
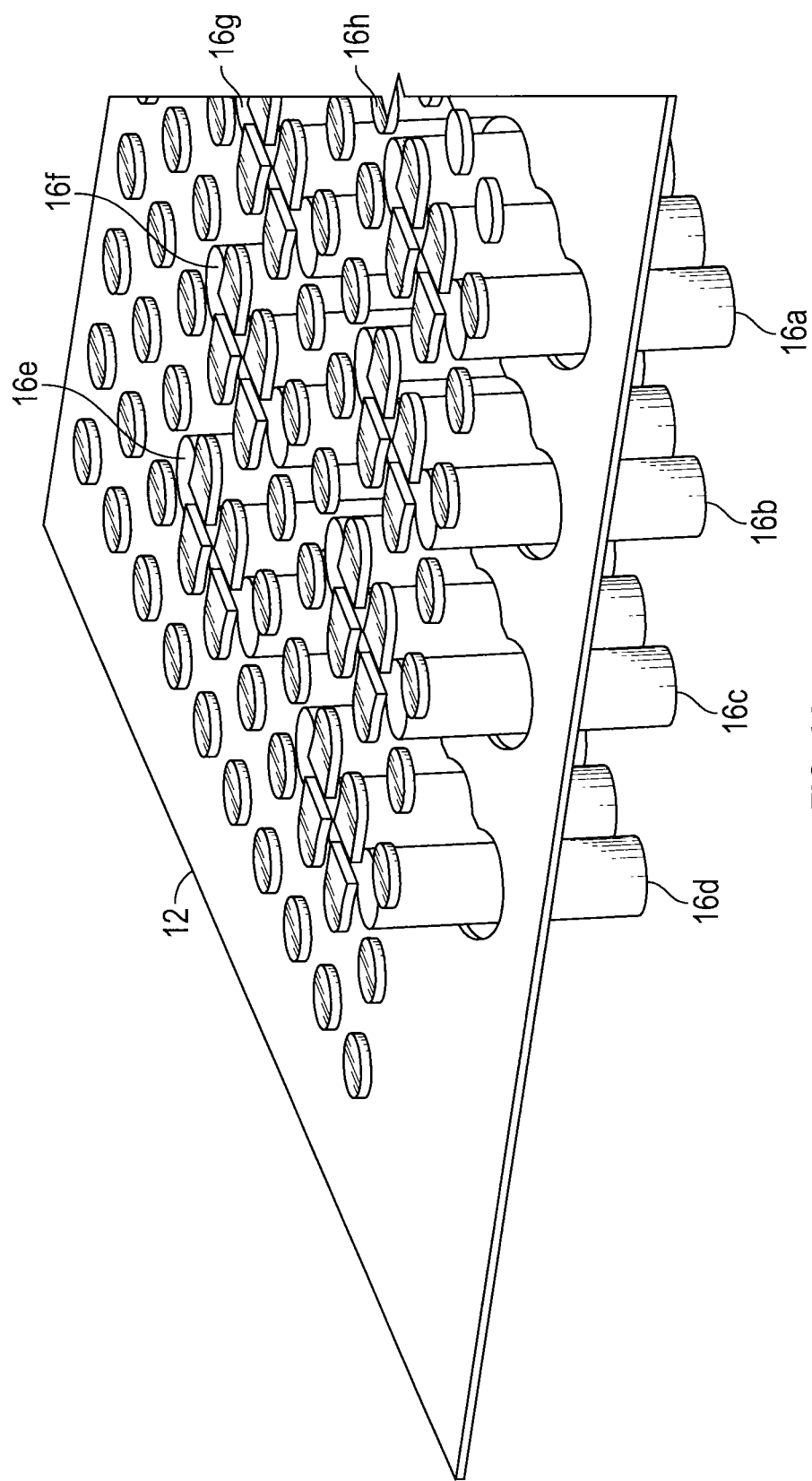

FIG. 14 is another partial perspective view of the substrate 12 having a 0.7 mm ball grid array shown positioned on multiple VCS 16a-h without traces shown.

Figure 15:
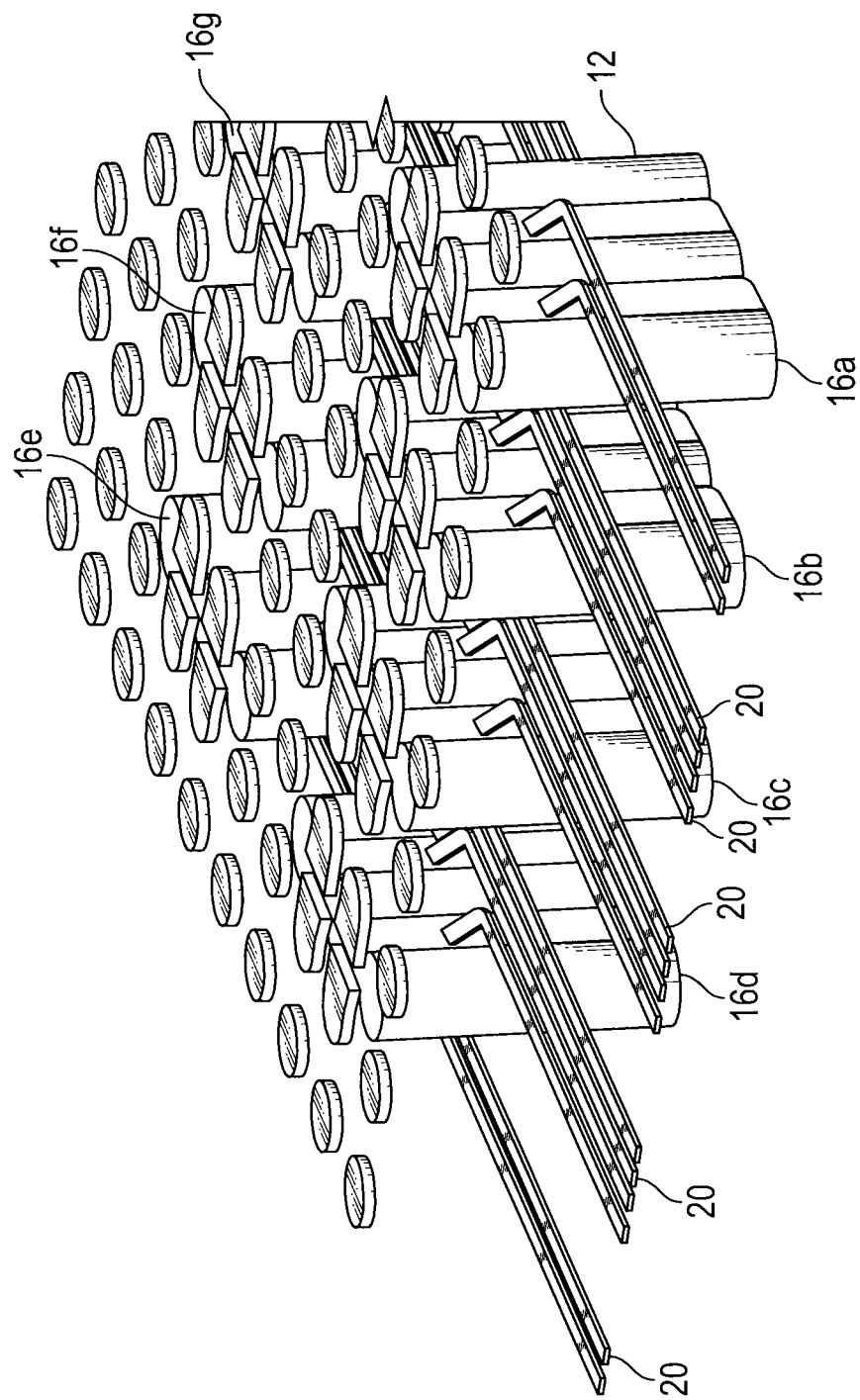

FIG. 15 is another partial perspective view of the substrate 12 with the ball grid array showing the VCS 16a-f showing electrically isolated conductive segments connected to traces 20 and extending from the VCS 16a-f. The ball grid array of FIG. 15 can be a 0.7 mm ball grid array.

Figure 16:
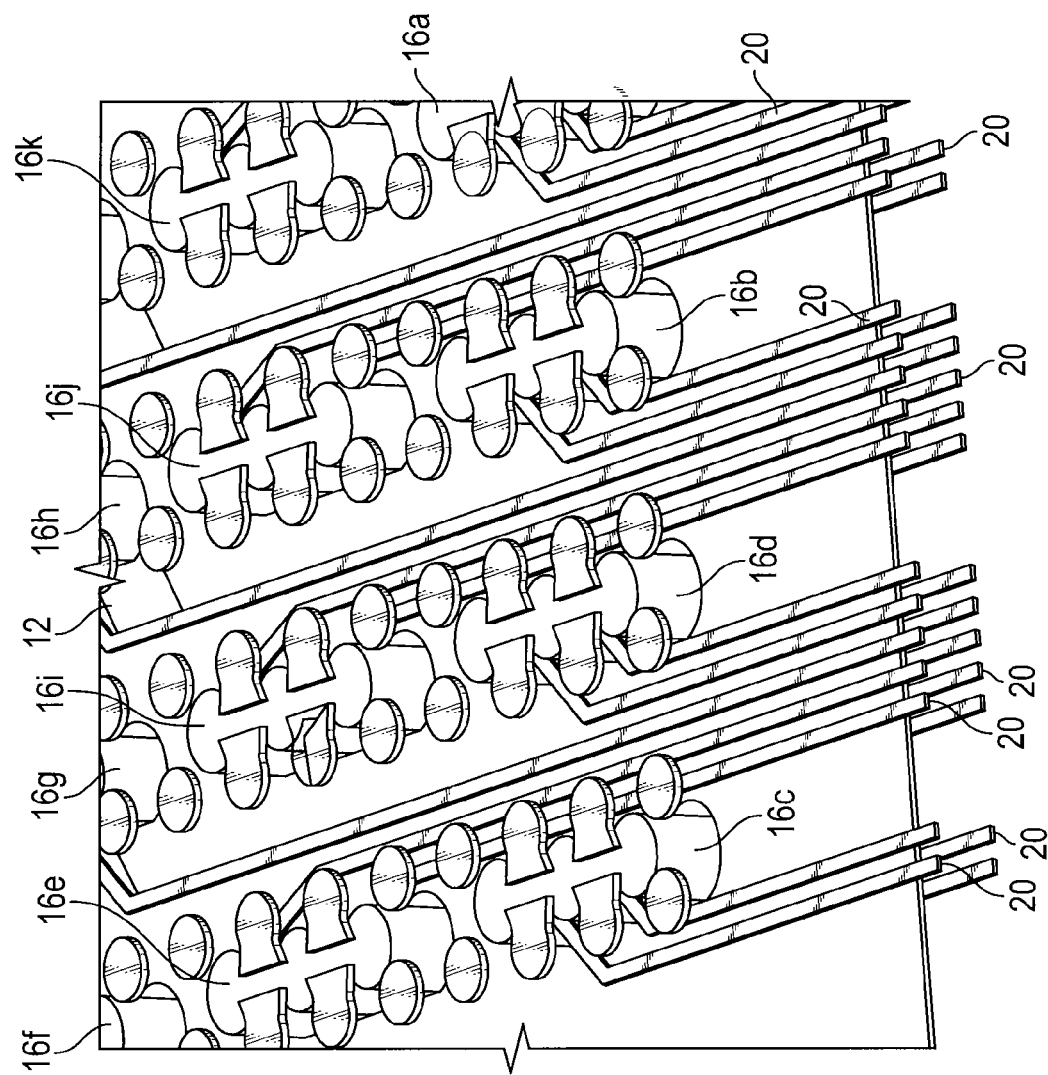

FIG. 16 is another partial perspective view of the substrate 12 showing traces 20 extending from multiple VCS 16a-k at multiple layers of the substrate 12.

Figure 17:
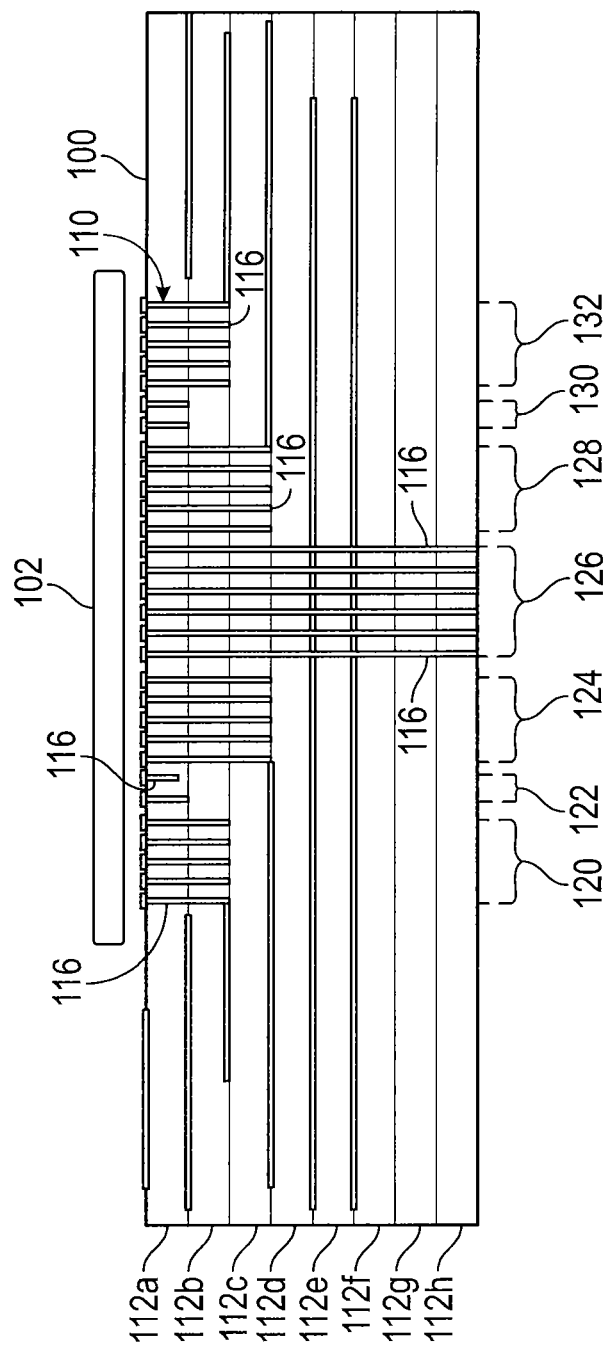
FIG. 17 is another example of a substrate having a vertical conductive structure constructed in accordance with the present invention in which the vertical conductive structure has conductive segments extending to differing layers and depths within the substrate. The conductive segments which extend to a certain layer are blind structures. The vertical conductive structure also has conductive segments extending through the substrate, which are through structures. When forming the vertical conductive structure of FIG. 17, forming a slot with portions extending to certain layers and other portions extending all of the way through the substrate enhances the circulation of fluid through the slot when applying platings and other materials to the substrate within the slot.

Although the vertical conductive structures 16a-f have been shown and described herein as through structures, it should be understood that the vertical conductive structures 16 can also be formed as blind structures, buried structures and combinations thereof. For example, FIG. 17 shows a cross-sectional diagram of a circuit board 100 with a BGA type of component 102 mounted to one or more vertical conductive structures 110 in accordance with the present disclosure. The circuit board 100 includes eight layers 112 that are numbered as 112a, 112b, 112c, 112d, 112e, 112f, 112g and 112h.

The one or more vertical conductive structure 110 can be constructed similar to the vertical conductive structures 16 discussed above, with the exception that when a slot is formed in the substrate 12, the slot is formed with a first region of the slot extending through a first number of layers of the substrate 12, and a second region of the slot extending through a second number of layers of the substrate 12, and with the first number of layers being different from the second number of layers. In certain instances, the substrate has N-layers which is this example is 8 layers, and the first number of layers may be equal to the N-layers. In this instance the first region would extend through the entire substrate 12.

For example, as shown, the vertical conductive structure 110 may include 7 regions 120, 122, 124, 126, 128, 130 and 132. Each of the regions 120, 122, 124, 126, 128, 130 and 132 has one or more conductive segments 116 (only a few being numbered for purposes of clarity) that extend to a preselected depth within the circuit board 100, which may be the same as or different than the depths that the one or more conductive segments 116 extend to in the other regions 120, 122, 124, 126, 128, 130 and 132. For example, the region 120 includes 5 conductive segments 116 that extend to the same depth (through the layers 112a and 112b) as the 5 conductive segments 116 in the region 132, i.e., passing through two layers of the circuit board 100 and have the same functionality of a conventional blind via. Further, the conductive segments 116 in the region 122 only extend through a single layer of the circuit board 100 and have the same functionality of a blind via. The conductive segments 116 in the region 126 extend all of the way through the circuit board 100 and have the same functionality as a conventional through via. Further, prior to the formation of the conductive segments 116, forming a slot all of the way through the circuit board 100 enhances the ability of fluids to flow into the slot and thereby assists in forming the conductive layers 47, 47a and 47b as discussed above with reference to FIGS. 2D, 4D and 5E. The circuit board 100 can be formed in the manners described above for making the circuit board 10 using controlled-depth milling (i.e., milling at different depths) to form a cavity which is subsequently plated and then subjected to separated drilling, milling or other operation to remove preselected portions of the conductive layer to form the conductive segments 116, as well as removing any conductive material or etchresist from a bottom of the slot to electrically isolate the conductive segments 116.

Figure 18:
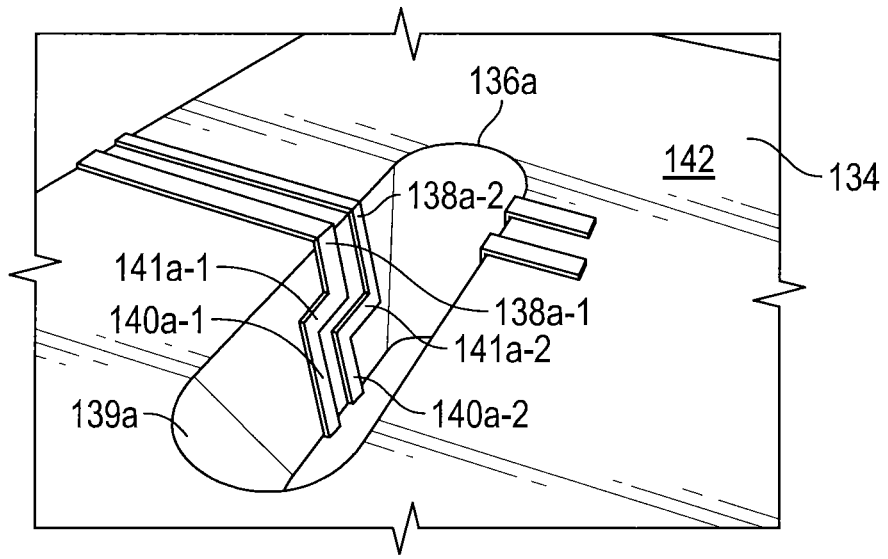
FIG. 18 is yet another example of a substrate having a vertical conductive structure constructed in accordance with the present disclosure in which the vertical conductive structure has one or more trace extending along a sidewall in a non-linear configuration.
Figure 19:
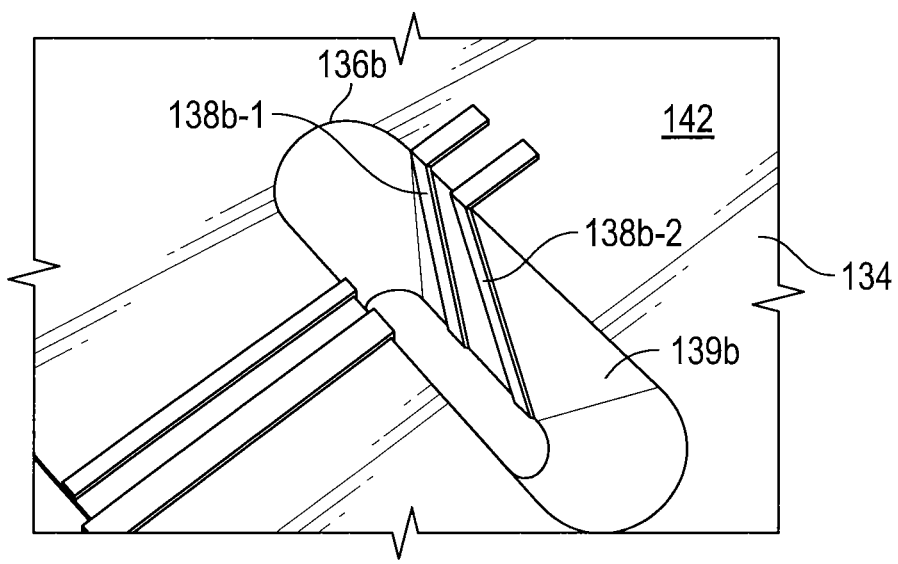
FIG. 19 is yet another example of a substrate having a vertical conductive structure constructed in accordance with the present disclosure in which the vertical conductive structure has multiple traces extending along a sidewall in a non-parallel configuration and with at least one of the traces extending at an angle relative to the upper surface at less than or greater than 90 degrees.

FIGS. 18 and 19 show other embodiments of a substrate 134 of a multi-layer circuit board having vertical conductive structures 136a (FIG. 18) and 136b (FIG. 19) constructed in accordance with the present disclosure. The vertical conductive structures 136a and 136b include a plurality of traces 138a-1, 138a-2, 138b-1 and 138b-2 extending on a sidewall 139a and 139b. As shown, the traces 138a-1 and 138a-2 have two first portions 140a-1 and 140a-2 that extend vertically on the sidewall 139a, and one second portions 141a-1 and 141a-2 that extend horizontally on the sidewall 139a. The traces 138b-1 and 138b-2 extend on the sidewall 139b in a manner that is not parallel with one another, and are also at a non-90 degree angle with respect to an upper surface 142 of the substrate 134. The configurations of the traces 138a-1, 138a-2, 138b-1 and 138b-2 are shown by way of example, and it should be understood that the traces 138a-1, 138a-2, 138b-1 and 138b-2 can have a variety of shapes, including linear portions, arc shaped portions and combinations of linear and arc shaped portions that connect with traces (not shown) that are internal or external to the substrate 134. The vertical conductive structures 136a (FIG. 18) and 136b (FIG. 19) are shown in a through hole configuration, but the vertical conductive structures 136a (FIG. 18) and 136b (FIG. 19) could be constructed in a blind configuration as well.

Figure 20:
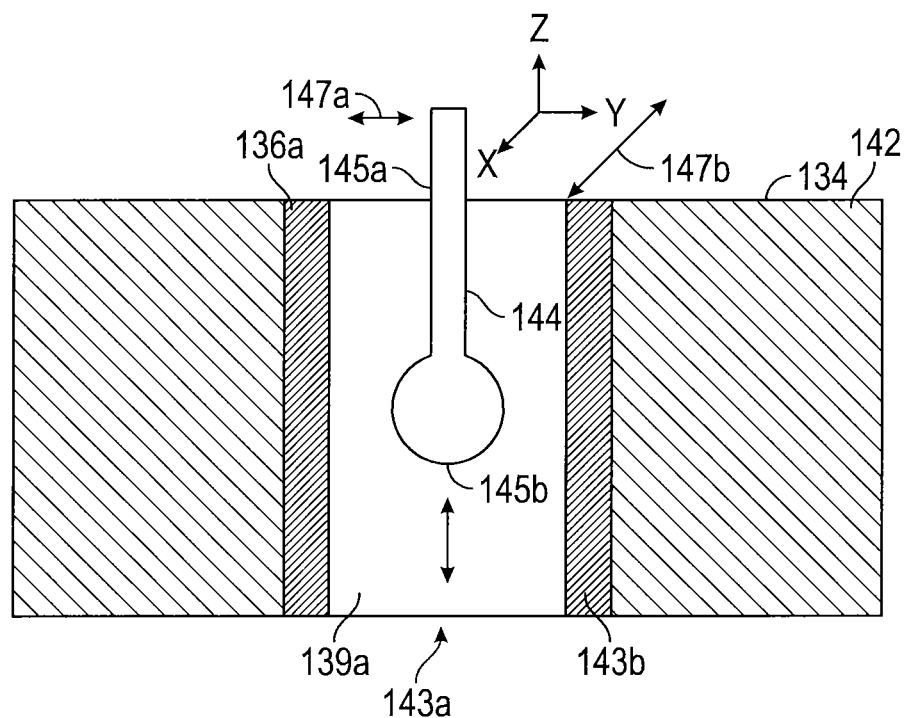
FIG. 20 is a cross-sectional view of a substrate having a slot in which a router bit is disposed and guided to form the traces depicted in FIG. 18 or 19. The routerbit in the example can have a ball tip but also may have any other shape of tip extending outwardly from the router bit shaft such that the router bit shaft does not touch the sidewall of the VCS when the tip is engaging the sidewall. The sidewalls of the VCS do not need to be normal to the upper surface of the substrate, or parallel to one another, but can be angled toward each other in the form of a tapered slot.
Figure 21:
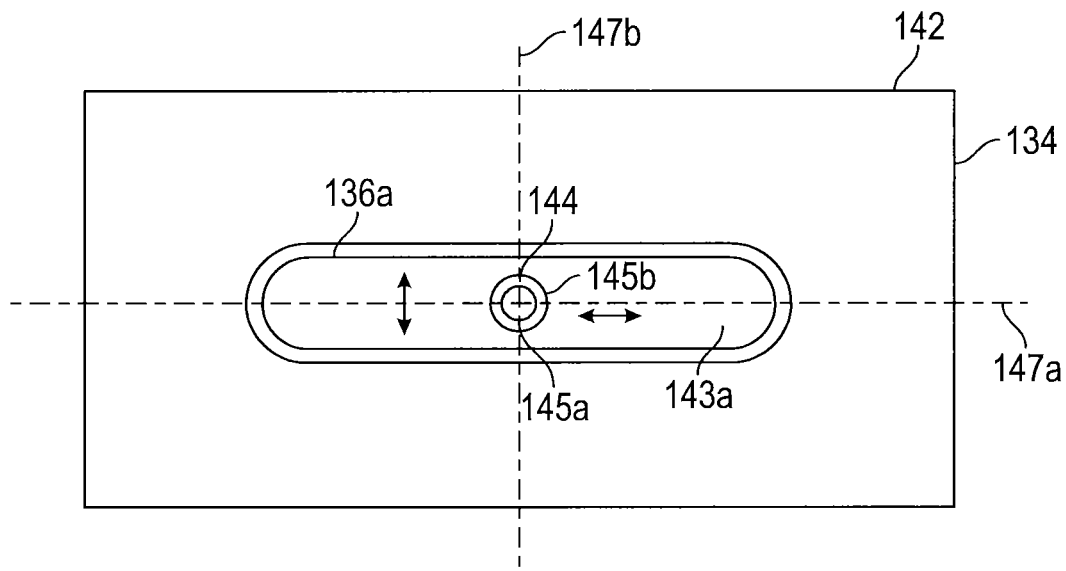
FIG. 21 is a top plan view of the substrate of FIG. 20 showing the router bit positioned within the slot of the substrate.

Shown in FIGS. 20 and 21 is an exemplary methodology for forming the traces 138a-1, 138a-2, 138b-1 and 138b-2. The vertical conductive structures 136a and 136b can be formed as discussed above by forming a slot 143a within the substrate 134, and then applying a plating of conductive material 143b to the sidewalls 139a and 139b of the slot 143a. As discussed above, the conductive material 143b can be gold or copper, for example. Then, a router bit 144 having a shaft 145a and a cutting end 145b is disposed into the slot 143a. The cutting end 145b extends outwardly beyond the perimeter of the shaft 145a such that the cutting end 145b can engage and cut predetermined portions of the conductive material 143b to remove unwanted portions of the conductive material 143b and thereby form the traces 138a-1, 138a-2, 138b-1 and 138b-2. The cutting end 145b can have any suitable shape, such as a ball shape as shown. The router bit 144 can be connected to a computerized guiding system (not shown) that has motors, mechanical structure and guides for rotating, supporting and moving the router bit 144 in at least three different directions, for example, along an X-axis, a Y-axis and a Z-axis for engaging the cutting end 145b with the conductive material 143b to remove the unwanted portions of the conductive material 143b. In this example, the slot 143a has a longitudinal axis 147a and a lateral axis 147b extending normal to the longitudinal axis 147a. The longitudinal axis 147a can be aligned with the Y-axis of the computerized guiding system, the lateral axis 147*b* can be aligned with the X-axis of the computerized guiding system, and the Z-axis of the computerized guiding system can be normal to the upper surface 142. In another embodiment, predetermined portions of the vertical conductive structures 136*a* and 136*b* can be removed to form the traces 138*a*-1, 138*a*-2, 138*b*-1 and 138*b*-2 using an imaging process. In this embodiment, the vertical conductive structures 136*a* and 136*b* are plated with a positive or negative photoresist material. Thereafter, predetermined portions of the photoresist material are exposed to light and then an etching process is used to remove unwanted portions of the vertical conductive structures 136*a* and 136*b* to form the traces 138*a*-1, 138*a*-2, 138*b*-1 and 138*b*-2. The predetermined portions of the photoresist material can be exposed to light by using a laser connected to and emitting light through a fiber tip (not shown). The fiber tip can be connected to the computerized guiding system that has motors, mechanical structure and guides for rotating, supporting and moving the fiber tip in at least three different directions, for example, along an X-axis, a Y-axis and a Z-axis for aiming the light emitted by the fiber tip onto wanted and/or unwanted portions of the photoresist material to permit a subsequent etching process to remove the unwanted portions of the conductive material 143*b*. After the traces 138*a*-1, 138*a*-2, 138*b*-1 and 138*b*-2 are formed, the slot 143*a* can be filled and overplated.

Figure 22:
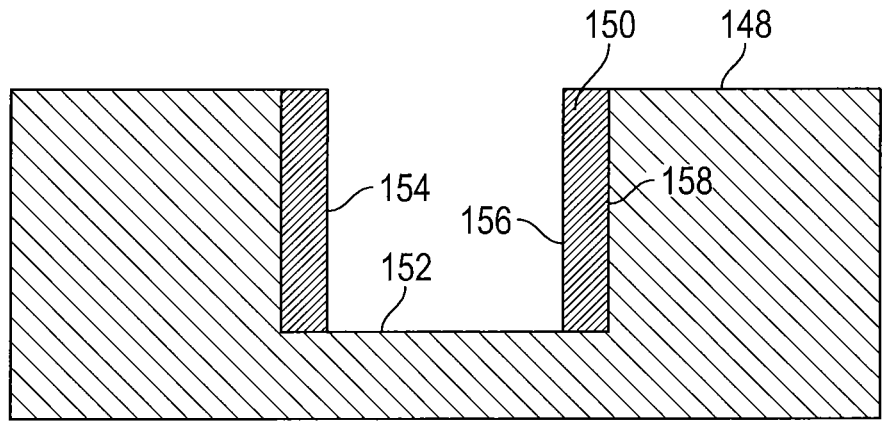
FIG. 22 is a cross-sectional view of another example of a substrate having a vertical conductive structure constructed in accordance with the present disclosure in which the vertical conductive structure is constructed in a blind configuration having a bottom, which is constructed of a dielectric material so as to electrically isolate a first conductive segment and a second conductive segment of the vertical conductive structure.

FIG. 22 is a cross-sectional view of another example of a substrate 148 having a vertical conductive structure 150 constructed in accordance with the present disclosure in which the vertical conductive structure 150 is constructed in a blind configuration having a bottom 152. The bottom 152 is constructed of a dielectric material so as to electrically isolate a first conductive segment 154 from a second conductive segment 156 of the vertical conductive structure 150. The vertical conductive structure 150 can be constructed in a manner similar to the construction of the vertical conductive structure 16 described above with further processing steps to avoid the plating of the bottom 152 with a conductive material, or to entirely remove a conductive material from the bottom 152. The conductive material can be removed from the bottom 152 using a fiber tip using an imaging process in which a photoresist is applied to the conductive material on the bottom 152, the photoresist is exposed to light using any suitable light source, such as a laser emitting light through a fiber tip, and an etching process. The vertical conductive structure 150 also includes a sidewall 158 supporting the first conductive segment 154 and the second conductive segment 156.

Figure 23:
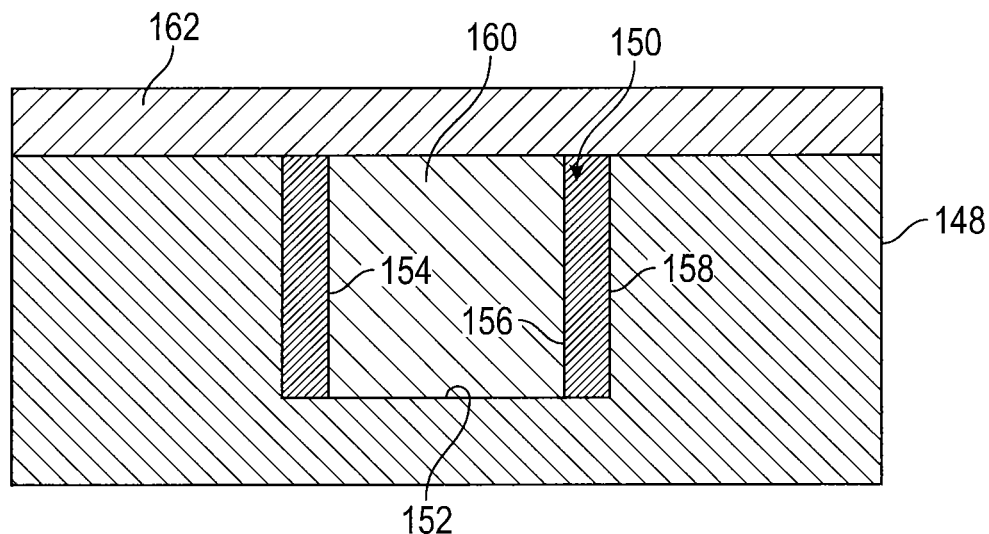
FIG. 23 is a cross-sectional view of the substrate and the vertical conductive structure depicted in FIG. 22 having a filling material within the vertical conductive structure, and one or more layers covering the vertical conductive structure such that the vertical conductive structure of FIG. 23 is in a buried configuration.

FIG. 23 is a cross-sectional view of the substrate 148 and the vertical conductive structure 150 depicted in FIG. 22 having a filling material 160 within the vertical conductive structure 150, and one or more layers 162 of printed circuit board material covering the vertical conductive structure 150 such that the vertical conductive structure 150 of FIG. 23 is in a buried configuration.

Figure 24:
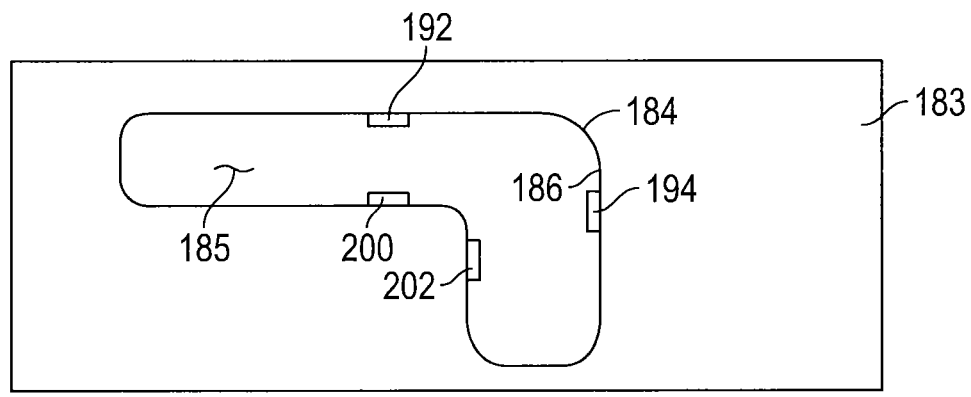
FIG. 24 is a top plan view of yet another example of a substrate having a vertical conductive structure constructed in accordance with the present disclosure in which the vertical conductive structure is constructed in a blind configuration having a bottom and is provided with a non-linear shape.
Figure 25A:
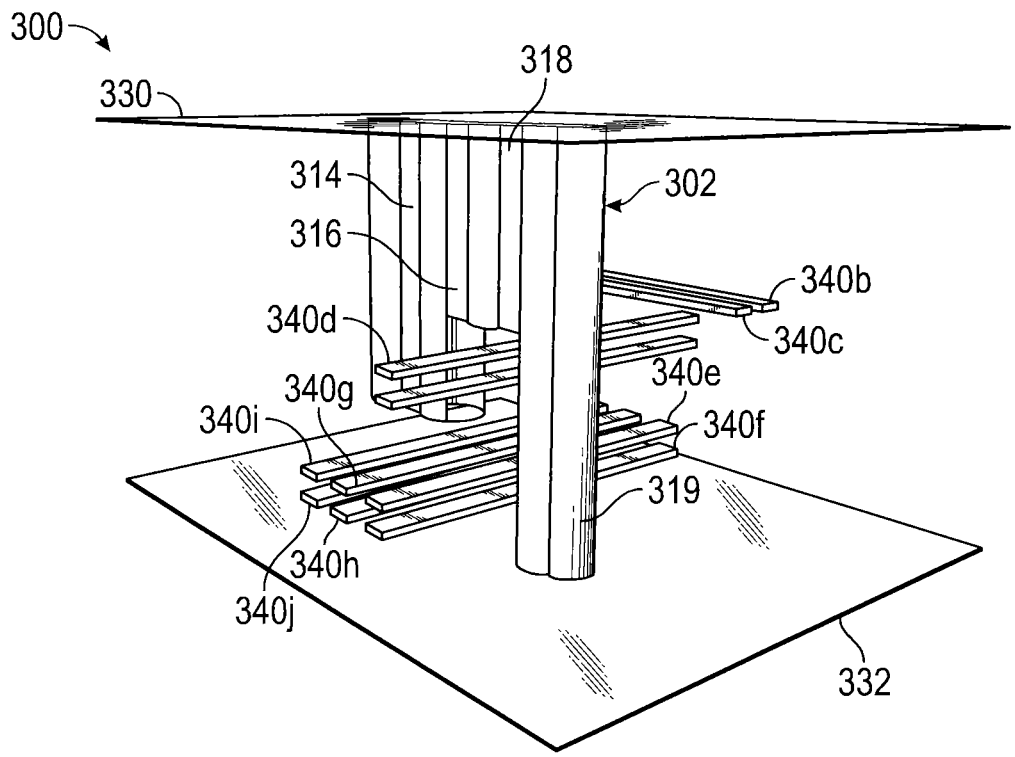
FIGS. 25a-25e are partial perspective views of another example of a printed circuit board having a vertical conductive structure including several blind structures going to different depths within the printed circuit board and on the right—a through structure.
Figure 25B:
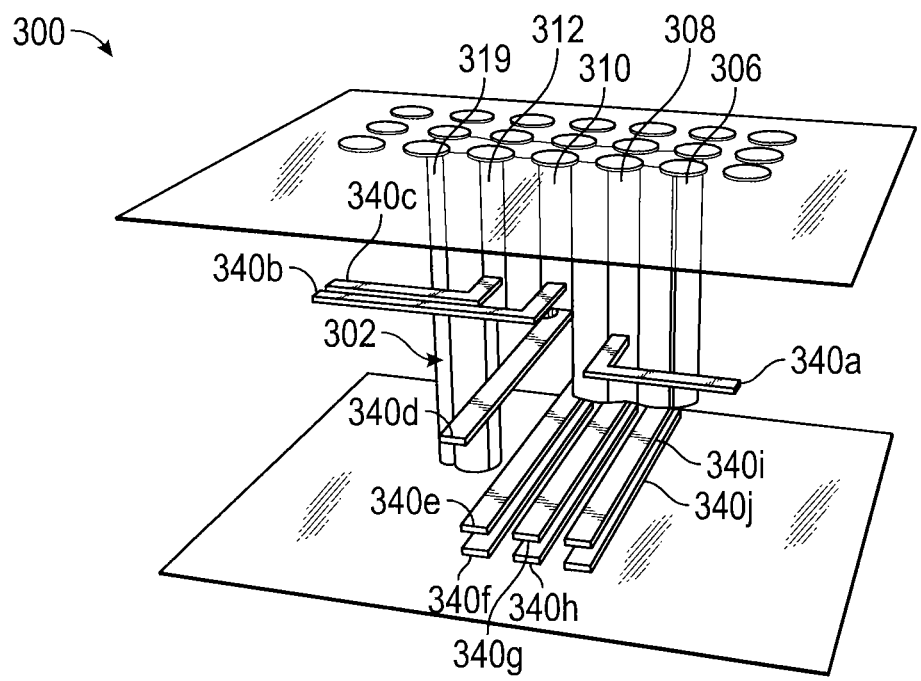
Figure 25C:
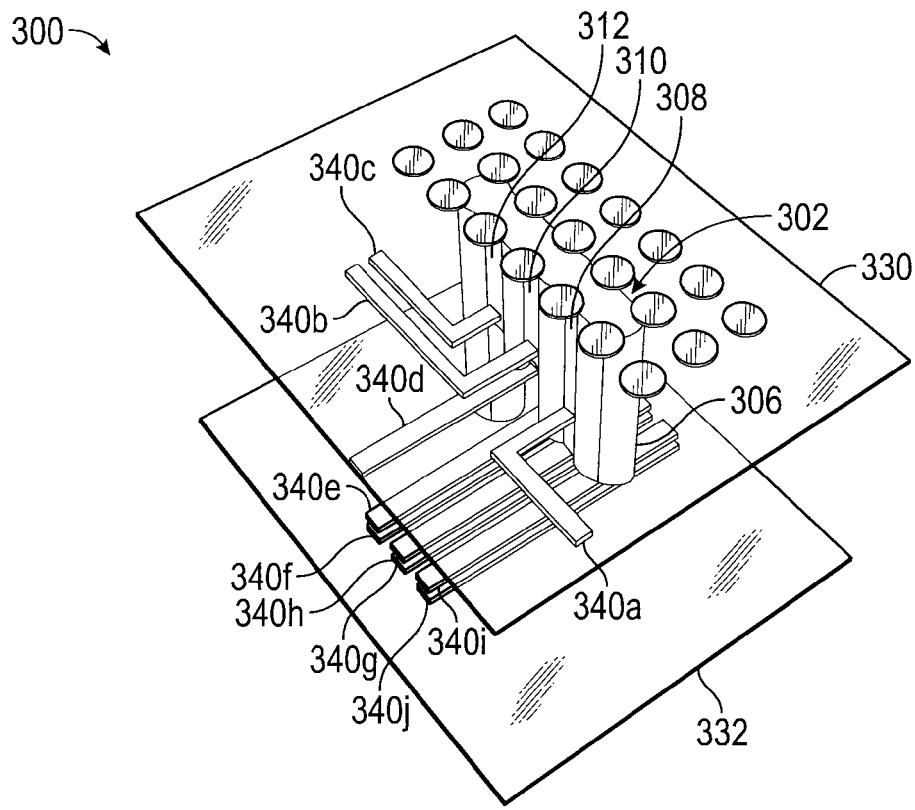
Figure 25D:
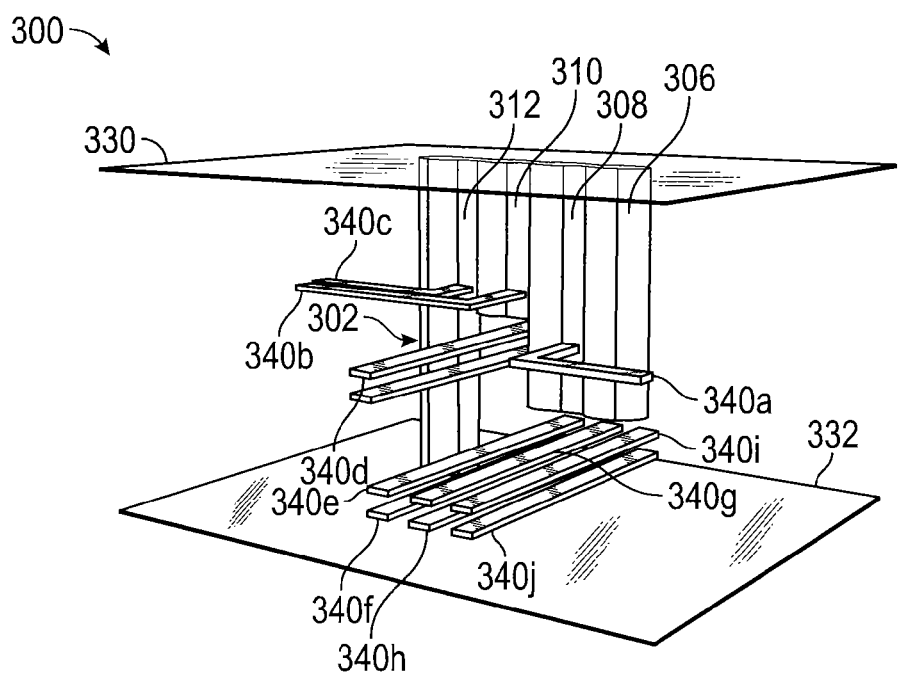
Figure 25E:
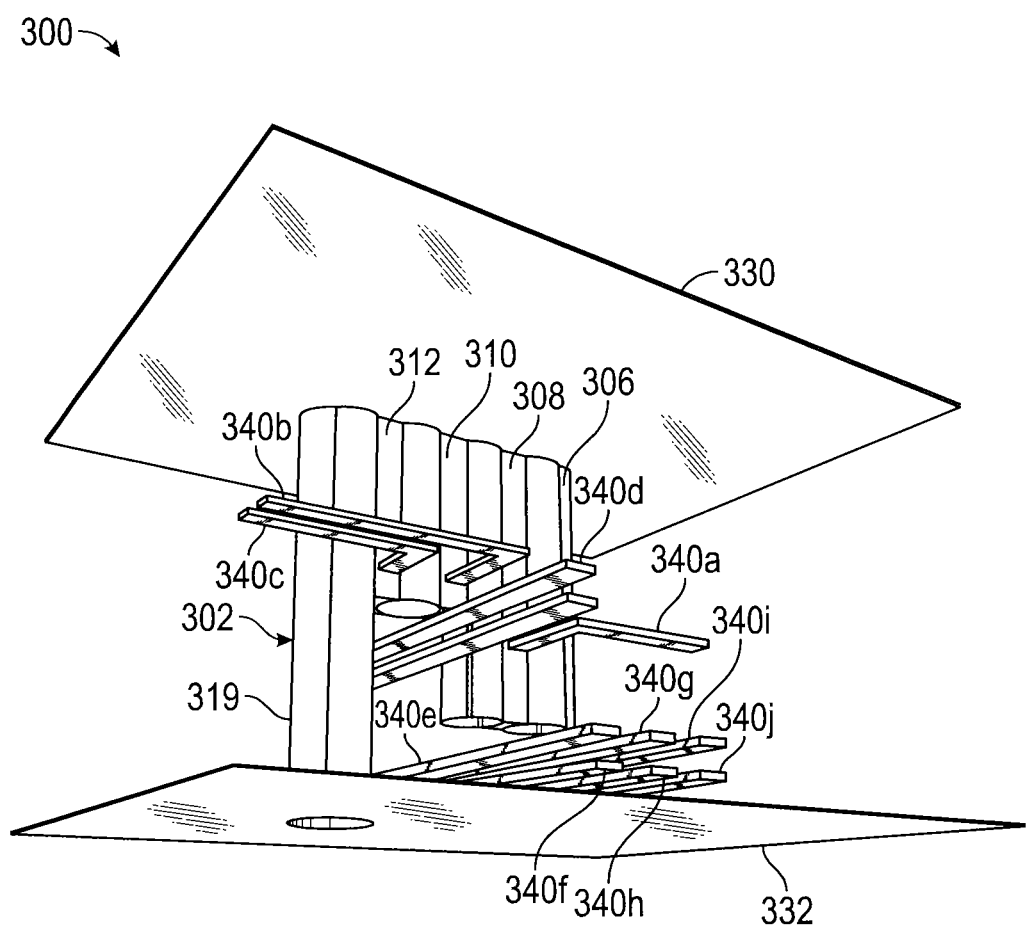

FIG. 24 is a top plan view of yet another example of a substrate 183 having a vertical conductive structure 184 constructed in accordance with the present disclosure in which the vertical conductive structure 184 is constructed in a blind configuration having a bottom 185 and a sidewall 186, which is partially coated with a conductive material to form a first conductive segment 192, a second conductive segment 194, a third conductive segment 200, and a fourth conductive segment 202. In this example, the sidewall 186 is shaped in the form of a hockey-stick and it should be understood that the sidewall 186 can be formed in many shapes, including an elongated linear slot as discussed above, a cross, bend, arc or a donut shape.

FIGS. 25*a*-25*e* are partial perspective views of another example of a printed circuit board 300 constructed in accordance with the embodiments disclosed above in which the printed circuit board 300 has a vertical conductive structure 302 including several blind structures having conductive segments 306, 308, 310, 312, 314, 316, and 318 with the conductive segments 306, 308, and 314 going to different depths within the printed circuit board 300 than the conductive segments 310, 312, 316 and 318. The vertical conductive structure 302 also includes a through structure having a conductive segment 319. The conductive segments 306, 308, 310, 312, 314, 316, and 318 can be constructed of any suitable conductive material(s), such as copper, silver or gold, as discussed above. The printed circuit board 300 includes a first side 330, and a second side 332 that opposes the first side 330. The printed circuit board 300 also includes a plurality of traces 340*a*, 340*b*, 340*c*, 340*d*, 340*e*, 340*f*, 340*g*, 340*h*, 340*i* and 340*j* that extend between the first side 330 and the second side 332. The traces 340*a*, 340*b*, 340*c*, 340*d*, 340*e*, 340*f*, 340*g*, 340*h*, 340*i* and 340*j* can be made of any suitable conductive material(s), such as copper, silver or gold, as discussed above. The conductive segment 308 is electrically connected to the trace 340*a*, the conductive segment 310 is electrically connected to the trace 340*b*, and the conductive segment 312 is electrically connected to the trace 340*c*. The traces 340*d*-340*i* are electrically isolated from the conductive segments 306, 308, 310, 312, 314, 316 and 319.

The conductive segments 306, 308, 310, 312, 314, 316 intersect and extend from the first side 330 and terminate prior to intersecting the second side 332. The conductive segment 319 intersects both the first side 330 and the second side 332 and also extends between the first side 330 and the second side 332. Optionally, a filling material can be positioned between adjacent pairs of the conductive segments 306, 308, 310, 312, 314, 316 and 319 to provide structural support for contact pads and also assist in electrically isolating the conductive segments 306, 308, 310, 312, 314, 316 and 319.

It should be further understood that the vertical conductive structures discussed herein are shown in a linear or straight configuration, but may also be bent, arced, or any or any other shape that supports the design.

It will be understood from the foregoing description that various modifications and changes may be made in the preferred and alternative embodiments of the present invention without departing from its true spirit. For example, embodiments of the invention can be combined with High Density Interconnect (HDI) technology. As standard PCB technology knows many different constructions where vertical conductive structures are created as through holes, blind holes and/or buried holes so can the vertical conductive structures 16, 110, 136*a*, 136*b*, 150, 162 and 184. Thus, the processes described herein can be applied in combination with known PCB technology, including but not limited to the embedding of passive components and/or active components into the PCB, as well as a number of sequential/high density interconnect build-up constructions. Any sequential or high density interconnect constructions using through holes or any buried and blind holes/microvias can be turned into constructions using the vertical conductive structures 16, 110, 136*a*, 136*b*, 150, and 184. Further, the processes described herein for forming the vertical conductive structures 16, 110, 136*a*, 136*b*, 150, and 184 can be used to construct single chip modules, multi-chip modules and printed circuit boards including back planes and mid planes.

From the above description, it is clear that the inventive concepts disclosed and claimed herein are well adapted to carry out the objects and to attain the advantages mentioned herein, as well as those inherent in the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and/or as defined in the appended claims.

What is claimed is:

1. A method for producing a printed circuit board, comprising the steps of:
    forming a slot in a substrate having at least three layers with the slot extending through at least two of the layers, the slot having a length and a width with the length being greater than the width, the slot having a first end and a second end, the first end and the second end having a semi-circular shape, the slot being formed by laterally translating a router bit;
    coating a sidewall of the substrate surrounding the slot with a conductive layer; and
    separating the conductive layer into at least two segments that are electrically isolated along the side wall of the substrate.

2. The method of claim 1, wherein the slot is formed into a shape other than an elongated slot.

3. The method of claim 1, wherein the slot has at least one arc shaped section between two linear sections.

4. The method of claim 1, wherein the slot is in the form of at least one of an arc, a cross, an L-shape and combinations thereof.

5. The method of claim 1, wherein the substrate includes an outer surface intersected by the slot, and further comprising applying at least one layer to the outer surface of the substrate after the step of separating the conductive layer into at least two segments such that the at least one layer overlies and covers the at least two segments.

6. The method of claim 1, wherein the step of forming the slot includes forming at least a portion of the slot so as to avoid the slot extending through at least one of the layers so as to form a bottom of the slot, and wherein coating the sidewall of the substrate surrounding the slot with a conductive layer includes coating the bottom of the slot with a conductive layer.

7. The method of claim 6, further comprising the step of removing the coating on the bottom of the slot such that the bottom of the slot is devoid of a trace connecting any pair of segments of the at least two segments.

8. The method of claim 1, wherein forming the slot in the substrate includes forming the slot in the substrate with a first region of the first slot extending through a first number of layers of the substrate, and a second region of the slot extending through a second number of layers of the substrate, and with the first number of layers being different from the second number of layers.

9. The method of claim 8, wherein the substrate has N-layers, and wherein the first number of layers is equal to N-layers.

10. The method of claim 8, wherein the substrate has N-layers, and wherein the first number of layers is less than N, and the second number of layers is less than N.

11. The method of claim 1, wherein at least one of the conductive segments extends at a non-90 degree angle along the length of the slot and with respect to an upper surface of the substrate.

12. The method of claim 1, wherein the conductive segments on a side of the slot are not parallel.

13. The method of claim 1, wherein the step of separating the conductive layer into at least two segments that are electrically isolated along the side wall of the substrate, is defined further as applying a photoresist to the conductive layer; exposing predetermined portions of the photoresist to light from a laser using a fiber tip supported and guided by a computerized guiding system; and etching predetermined portions of the conductive layer between the at least two segments to electrically isolate the at least two segments.

14. The method of claim 1, wherein the step of separating the conductive layer into at least two segments that are electrically isolated along the side wall of the substrate, is defined further as applying a photoresist to the conductive layer; exposing predetermined portions of the photoresist to light from a fiber tip located inside of the slot; developing and etching predetermined portions of the conductive layer between the at least two segments to electrically isolate the at least two segments.

15. The method of claim 1, wherein the length of the slot is at least 2.85 times greater than the width of the slot.

16. A method for producing a printed circuit board, comprising the steps of:
    forming a first hole into a substrate having at least three layers with the hole extending through at least two of the layers, the hole having a center and a diameter;
    forming from the first hole into the substrate a cavity in the form of a slot, the slot having a width less than that of the diameter of the first hole and a length greater than the width of the slot;
    coating the substrate surrounding the cavity with a conductive layer;
    forming at least one second hole in the substrate to separate the conductive layer into at least two electrically isolated.

17. The method of claim 16, wherein the second hole is concentric with the first hole.

18. A method for producing a printed circuit board, comprising the steps of:
    forming a slot in a substrate having at least three layers with the slot extending through at least two of the layers, a perimeter of the slot having a length greater than a width;
    coating the perimeter of the slot with a conductive layer;
    forming at least one hole in the substrate with the hole overlapping at least two non-contiguous sections of the perimeter of the slot to form at least two electrically isolated segments such that at least one of the at least two electrically isolated segments forms a conductive path between a first conductive trace positioned externally of the substrate, and a second conductive trace positioned internally within the substrate.

19. A method for producing a printed circuit board, comprising the steps of:
    forming a slot in a substrate having at least three layers with the slot extending through at least two of the layers, the slot having a length and a width with the length being greater than the width, the slot having a first region extending through a first number of layers of the substrate, and a second region of the slot extending through a second number of layers of the substrate, and with the first number of layers being different from the second number of layers;

coating a sidewall of the substrate surrounding the slot with a conductive layer;

separating the conductive layer into at least two segments that are electrically isolated along the side wall of the substrate.

20. The method of claim 19, wherein the substrate has N-layers, and wherein the first number of layers is equal to N-layers.

21. The method of claim 19, wherein the substrate has N-layers, and wherein the first number of layers is less than N, and the second number of layers is less than N.

* * * * *